US010613130B1

(12) United States Patent
Forood et al.

(10) Patent No.: US 10,613,130 B1
(45) Date of Patent: Apr. 7, 2020

(54) STRAY VOLTAGE DETECTION SYSTEM FOR PROTECTING AGAINST ELECTRIC SHOCK DROWNING

(71) Applicants: Natalie Forood, Burlingame, CA (US); Walter Maclay, Sunnyvale, CA (US); Rolf Wendt, Santa Rosa, CA (US)

(72) Inventors: Natalie Forood, Burlingame, CA (US); Walter Maclay, Sunnyvale, CA (US); Rolf Wendt, Santa Rosa, CA (US)

( * ) Notice: Subject to any disclaimer, the term of this patent is extended or adjusted under 35 U.S.C. 154(b) by 271 days.

(21) Appl. No.: 15/878,061

(22) Filed: Jan. 23, 2018

Related U.S. Application Data

(60) Provisional application No. 62/451,693, filed on Jan. 28, 2017.

(51) Int. Cl.
*G01R 5/28* (2006.01)
*G01R 29/12* (2006.01)
*E04H 4/14* (2006.01)

(52) U.S. Cl.
CPC .............. *G01R 29/12* (2013.01); *E04H 4/14* (2013.01)

(58) Field of Classification Search
CPC .......................... G01R 19/00; G01R 19/0084; G01R 19/0092; G01R 19/10; G01R 19/145; G01R 19/15; G01R 19/155; G01R 19/165; G01R 19/1659; G01R 27/02; G01R 27/08; G01R 27/14; G01R 27/22; G01R 29/00; G01R 29/12; E04H 4/00; E04H 4/14; F21V 23/008; F21V 23/0435; G08B 7/06; G08B 21/02; F21L 4/00

USPC ....... 324/323, 347, 522, 600, 649, 658, 691, 324/713, 72, 72.5
See application file for complete search history.

(56) References Cited

U.S. PATENT DOCUMENTS

| 6,133,838 | A | 10/2000 | Menere |
| 9,285,396 | B2 | 3/2016 | King et al. |
| 2005/0218914 | A1 | 10/2005 | Brabers |
| 2014/0062708 | A1* | 3/2014 | Cargill, III et al. ... G01R 31/00 324/96 |

FOREIGN PATENT DOCUMENTS

WO    WO2010078617    7/2010

* cited by examiner

*Primary Examiner* — Melissa J Koval
*Assistant Examiner* — Courtney C McDonnough
(74) *Attorney, Agent, or Firm* — Jay Hendrickson

(57) ABSTRACT

A voltage detection system for detecting a stray voltage in pool water within a pool caused by an electrical fixture integral with a pool wall of the pool. The system comprises a pair of elongate conductive elements, with one of the elongate conductive elements having a detector electrode end and a terminal end, and with the other elongate conductive element having a reference electrode end and a terminal end. The detector electrode end is positioned adjacent to the electrical fixture and the reference electrode end is positioned on an opposite side of the pool and preferably a maximum distance from the detector electrode end. And, the terminal ends are connected to a microprocessor for determining if a voltage between the detector electrode end and reference electrode end is greater than a predetermined threshold voltage.

22 Claims, 26 Drawing Sheets

FIG. 1H    FIG. 1I    FIG. 1J    FIG. 1K

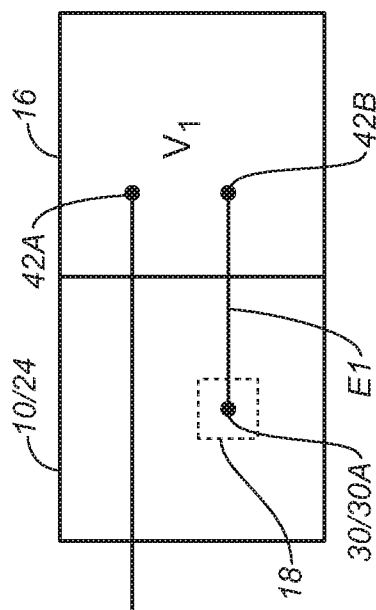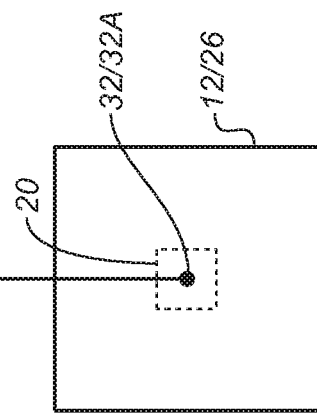
FIG. 2

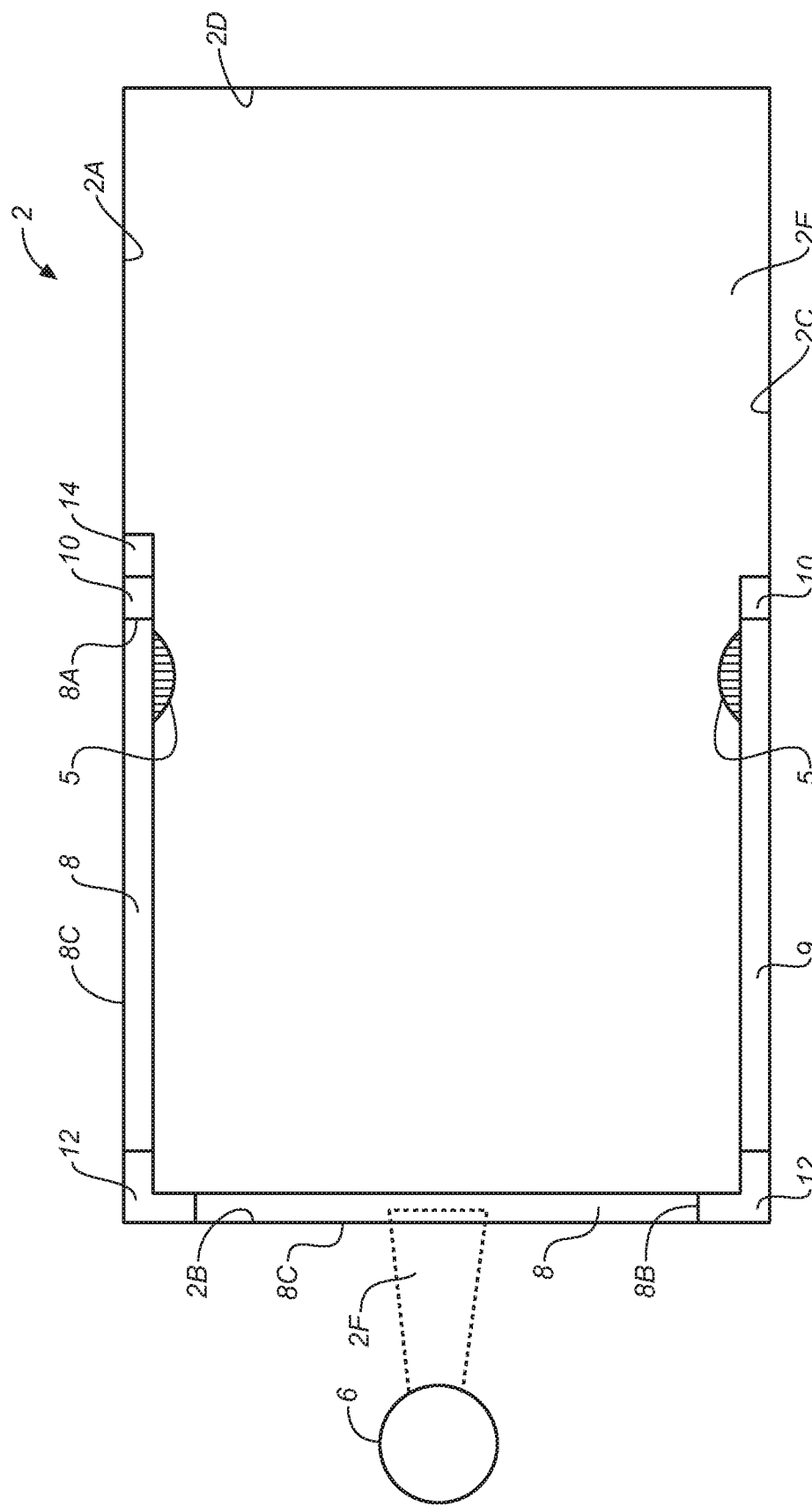

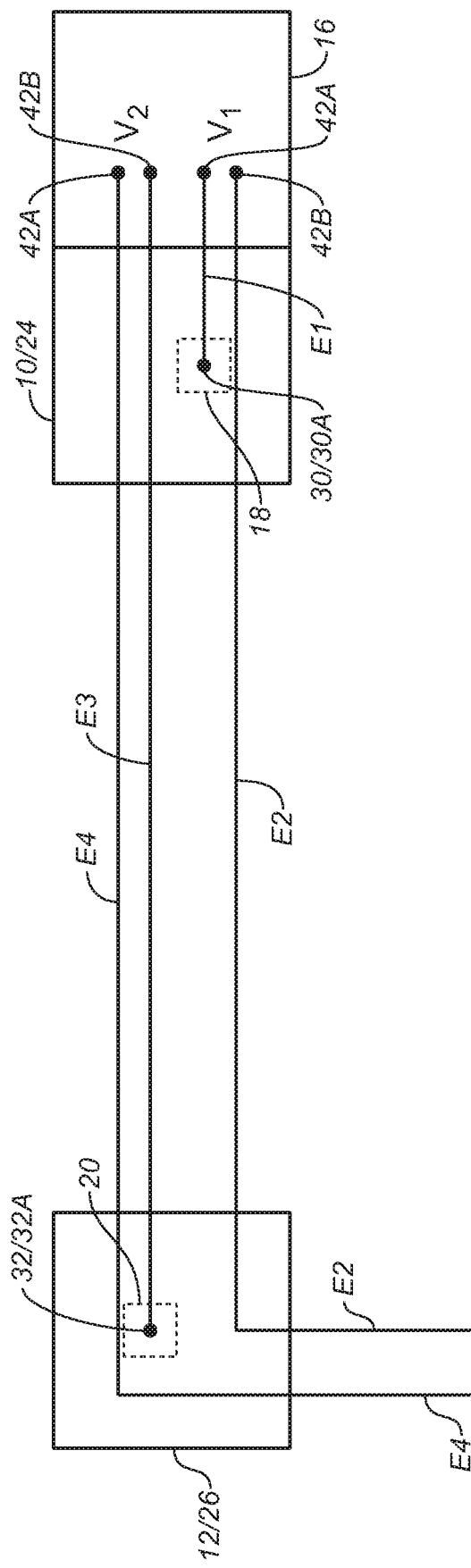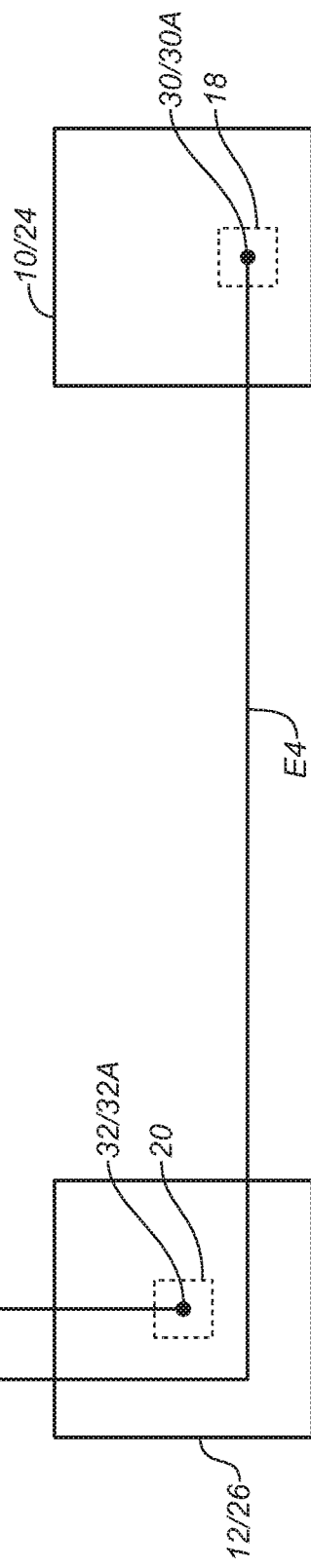
FIG. 9

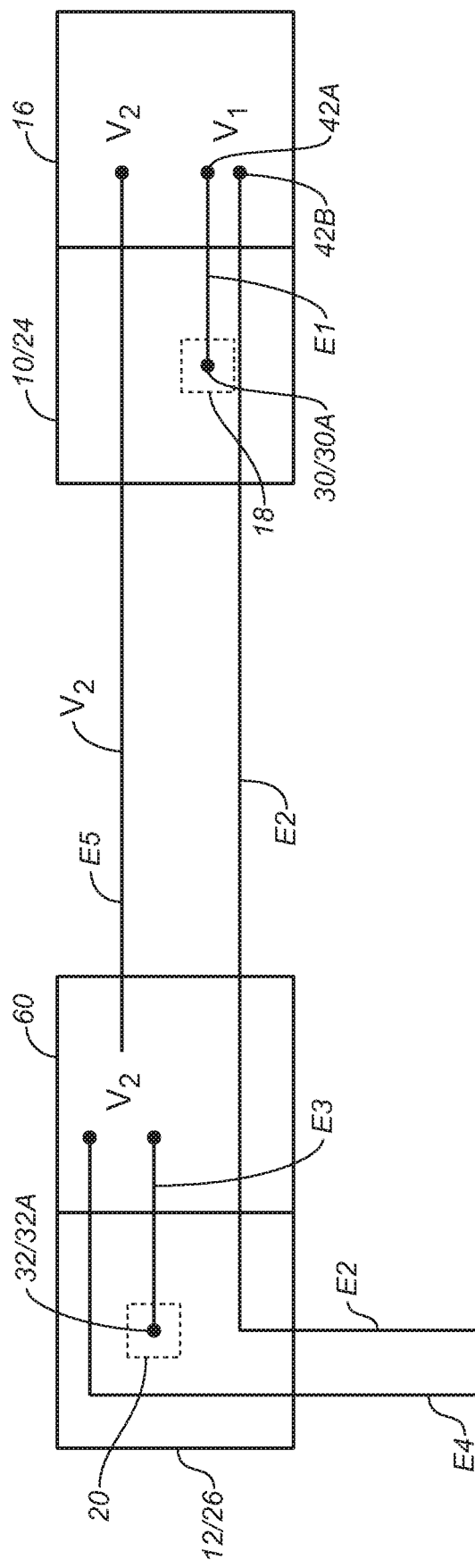
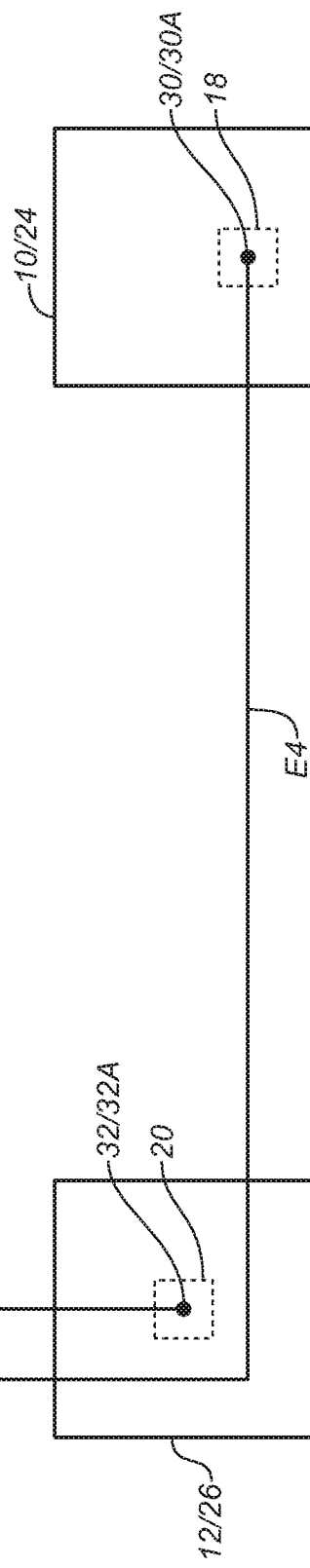
FIG. 12

US 10,613,130 B1

STRAY VOLTAGE DETECTION SYSTEM FOR PROTECTING AGAINST ELECTRIC SHOCK DROWNING

FIELD OF THE INVENTION

The present invention relates to the field of stray voltage detection systems for protecting against electric shock drowning or injury to swimmers and other persons when completely or partially immersed in a water containing swimming pool, spa, hot tub, bathtub, fountain or other similar water containing structures.

BACKGROUND

Numerous incidents of electric shock drowning or injury occur every year when a person immersed in a body of water comes in contact with a stray electrical current that exists in the water. This condition can occur, for example, due to a fault in an electric light fixture or other electrical fixture integral with the swimming pool wall, causing the stray electrical current to flow through the water to ground, which in turn creates a stray voltage field within the water. Anyone who comes in contact with the current is at risk of drowning due to being paralyzed by the electrical current or incurring serious injury to their nervous system. The danger is compounded by the fact that the existence of an electrical current in the water does not change the appearance of the water or create any type of sound that would alert a person to avoid the water. As a result, electric shock drowning is often referred to as a silent killer The purpose of the stray voltage detection system of the present invention is to efficiently and with a high degree of probability detect a stray voltage in the swimming pool water coming from an electrical fixture integral with a wall of the swimming pool and to generate an alarm to warn a person who intends to enter or is immersed the swimming pool water that there is a danger of electric shock in the water.

SUMMARY OF THE INVENTION

A voltage detection system for retrofitting a pool is described herein for detecting a stray voltage in pool water caused by an electrical fixture integral with a pool wall of the pool. The voltage detection system for retrofitting a pool comprises a first elongate conductive element and a second elongate conductive element, with the first and second elongate conductive elements forming a pair of elongate conductive elements. The first elongate conductive element has a detector electrode end and a connecting end, with the first elongate conductive element for attachment to the pool wall, and with the detector electrode end of the first elongate conductive element adjacent to a first surface of the pool wall, and adjacent to and as close as practicable to the electrical fixture. The second elongate conductive element has a reference electrode end and a connecting end, with the second elongate conductive element also for attachment to the pool wall, and with the reference electrode end of the second elongate conductive element adjacent to a second surface of the pool wall, which is across from and facing the first surface of the pool wall. The voltage detection system for retrofitting a pool also comprises a wireless transmitter in electrical connection with the connecting ends of corresponding first and second elongate conductive elements, with the wireless transmitter for detecting a stray voltage between the detector electrode end of the first elongate conductive element and the reference electrode end of the second elongate conductive element, and with the wireless transmitter for generating and wirelessly transmitting a voltage value signal to a wireless receiver. The wireless receiver is enabled to receive the voltage value signal from the wireless transmitter and to compare the first voltage value signal to a predetermined threshold voltage value. And, the wireless receiver generates an alert indicating that a dangerous stray voltage has been detected in the pool water if the voltage value signal exceeds the predetermined threshold voltage value.

Another voltage detection system for new pool construction is described herein for detecting a stray voltage in pool water caused by an electrical fixture integral with a pool wall of the pool. The voltage detection system for new pool construction, comprises a first elongate conductive element and a second elongate conductive element, with the first and second elongate conductive elements forming a pair of elongate conductive elements. The first elongate conductive element has a detector electrode end and a connecting end, with the first elongate conductive element disposed within the pool wall, and with the detector electrode end disposed within a first pool wall opening through the pool wall and positioned adjacent to and as close as practicable to the electrical fixture. The second elongate conductive element has a reference electrode end and a connecting end, with the second elongate conductive element disposed within the pool wall, with the reference electrode end disposed within a second pool wall opening through the pool wall, and with the second pool wall opening positioned across from and facing the first pool wall opening. The voltage detection system for new construction also comprises a microcontroller unit in electrical connection with the connecting ends of corresponding first and second elongate conductive elements. The microcontroller unit is for detecting a stray voltage between the detector electrode end of the first elongate conductive element and the reference electrode end of the second elongate conductive element, and with the microcontroller unit for generating a voltage value signal from the stray voltage and comparing the voltage value signal to a predetermined threshold voltage value. And, the microcontroller unit generates an alert indicating that a dangerous stray voltage has been detected in the pool water if the voltage value signal exceeds the predetermined threshold voltage value.

Also disclosed herein are similar voltage detection systems for retrofitting a pool and for incorporation into a newly constructed pool for use in detecting a stray voltage in the pool water coming from ground current.

BRIEF DESCRIPTION OF THE FIGURES

FIG. 1D through FIG. 1K present cross-sectional view illustrations of the components of the voltage detection assembly illustrated in FIG. 1C.

FIG. 2 is a schematic diagram illustrating the electrical wiring for the voltage detection assembly of the first retrofit embodiment of the stray voltage detection system.

FIG. 8B is a plan view illustration of the second retrofit embodiment of the stray voltage detection system.

FIG. 9 is a schematic diagram illustrating the electrical wiring for a voltage detection assembly of the second retrofit embodiment of the stray voltage detection system.

FIG. 12 is a schematic diagram illustrating the electrical wiring for the voltage detection assembly of the second retrofit embodiment of the stray voltage detection system, showing the addition of the voltage transmission module.

DETAILED DESCRIPTION OF THE INVENTION

The embodiments of the stray voltage detection system described herein are for retrofitting an existing swimming pool and for incorporation within a new swimming pool. The stray voltage detection system is exceptionally efficient and exhibits the highest probability for successfully detecting a stray voltage within the water of a swimming pool. In this regard, this reference to a "swimming pool" also includes a pool, spa, hot tub, bathtub, fountain or other similar water containing structures, which are collectively referred to herein as a "Pool", and with the water contained in the Pool referred to as the "pool water".

Figure 1A:
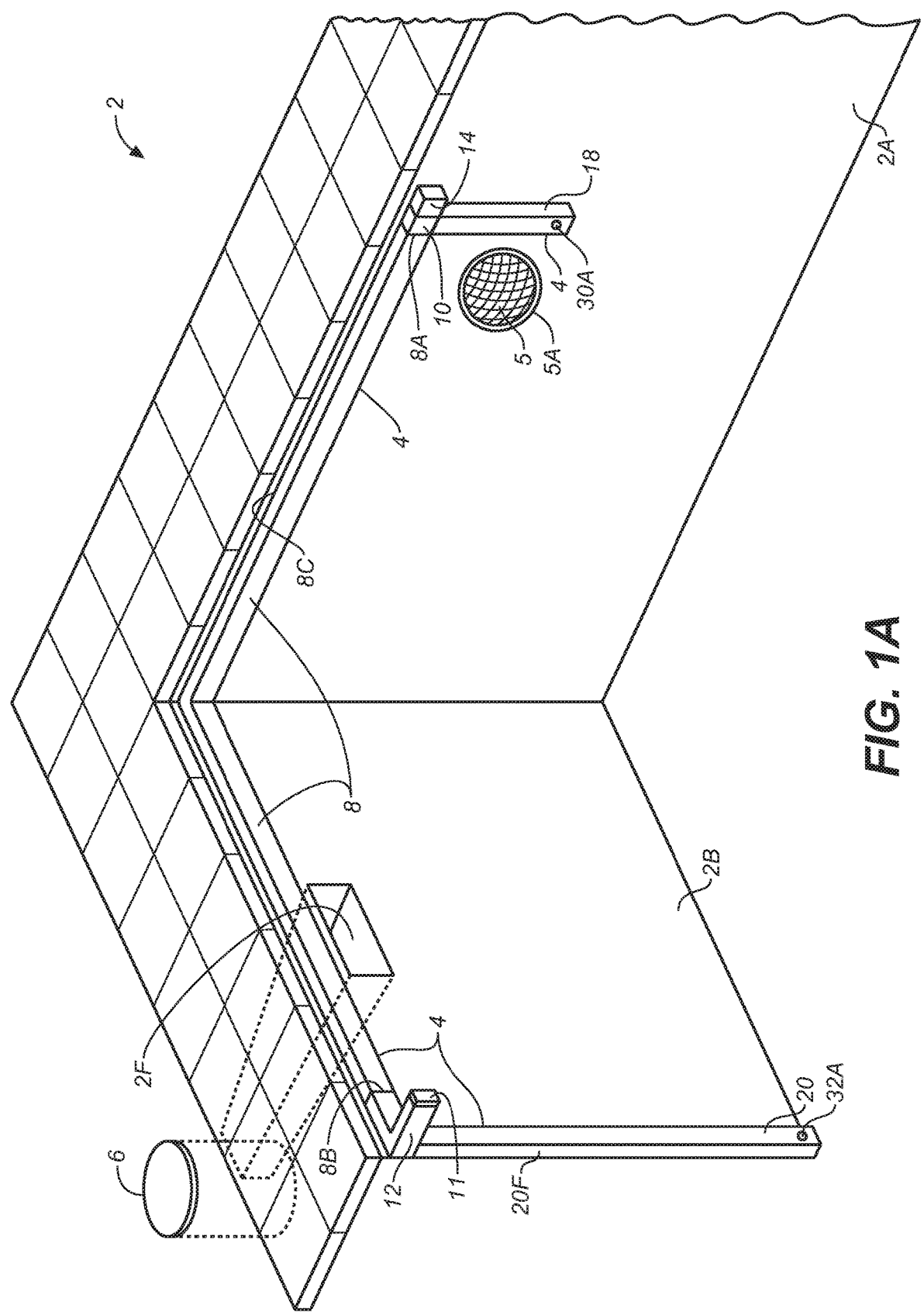
FIG. 1A is a perspective view illustration of a first retrofit embodiment of a stray voltage detection system for a rectangularly shaped pool having an electrical fixture integral with a pool wall.

A first retrofit embodiment of the stray voltage detection system is for retrofitting a Pool 2 (hereinafter referred to as the "first retrofit embodiment") having a rectangular shape, with the Pool 2 having pool walls 2A, 2B, 2C, and 2D, and pool bottom 2E, as illustrated in FIG. 1A through FIG. 7. In this embodiment, the Pool 2 has an electrical fixture, which is illustrated as a light fixture 5, that is integral with the inside surface of pool wall 2A of the Pool 2, with the light fixture 5, as illustrated in FIG. 1A and FIG. 1B, positioned at the midpoint between the intersection of pool walls 2A and 2B and the intersection of pool walls 2A and 2D, and further positioned below the level of the pool water, but closer to the level of the pool water than to the bottom side 2E of the Pool 2. The first retrofit embodiment generally comprises: a voltage detection assembly 4 for attachment to the Pool 2 and for detecting a stray voltage in the pool water; and a retrofit skimmer lid housing 6 for determining whether a stray voltage that has been detected in the pool water of Pool 2 is greater than a threshold voltage value.

The voltage detection assembly 4 comprises: an elongate module 8; a first junction module 10 and a first angled junction module 12; a transmission module 14 encasing a wireless transmitter unit 16; and a first pair of elongate electrode modules comprising elongate electrode modules, 18 and 20. The elongate module 8 preferably has a rectangular cross-sectional shape, with module opposing ends, 8A and 8B, and with the module opposing ends, 8A and 8B, containing module cavities, 8D and 8E, respectively. The elongate module 8 also has an elongate flat side 8C for use in attaching the elongate module 8, as shown in FIG. 1A, to adjacent pool walls, 2A and 2B, of Pool 2. A wire segment 22, which is insulated and electrically conductive, is embedded within the elongate module 8, preferably utilizing an overmolding process. An end of the wire segment 22 extends into the module cavity 8D of the elongate module 8, and the opposite end of the wire segment 22 extends into the module cavity 8E of the elongate module 8. A male electrical connector 23A is connected to the end of wire segment 22 that is disposed within module cavity 8D of elongate module 8, and a female electrical connector 23B is connected to the other end of the other end wire segment 22 that is disposed within module cavity 8E of the elongate module 8. In a preferred embodiment, the elongate module 8 is flexible and can be made of plastic or any similar flexible material that is not electrically conductive.

Figure 1B:
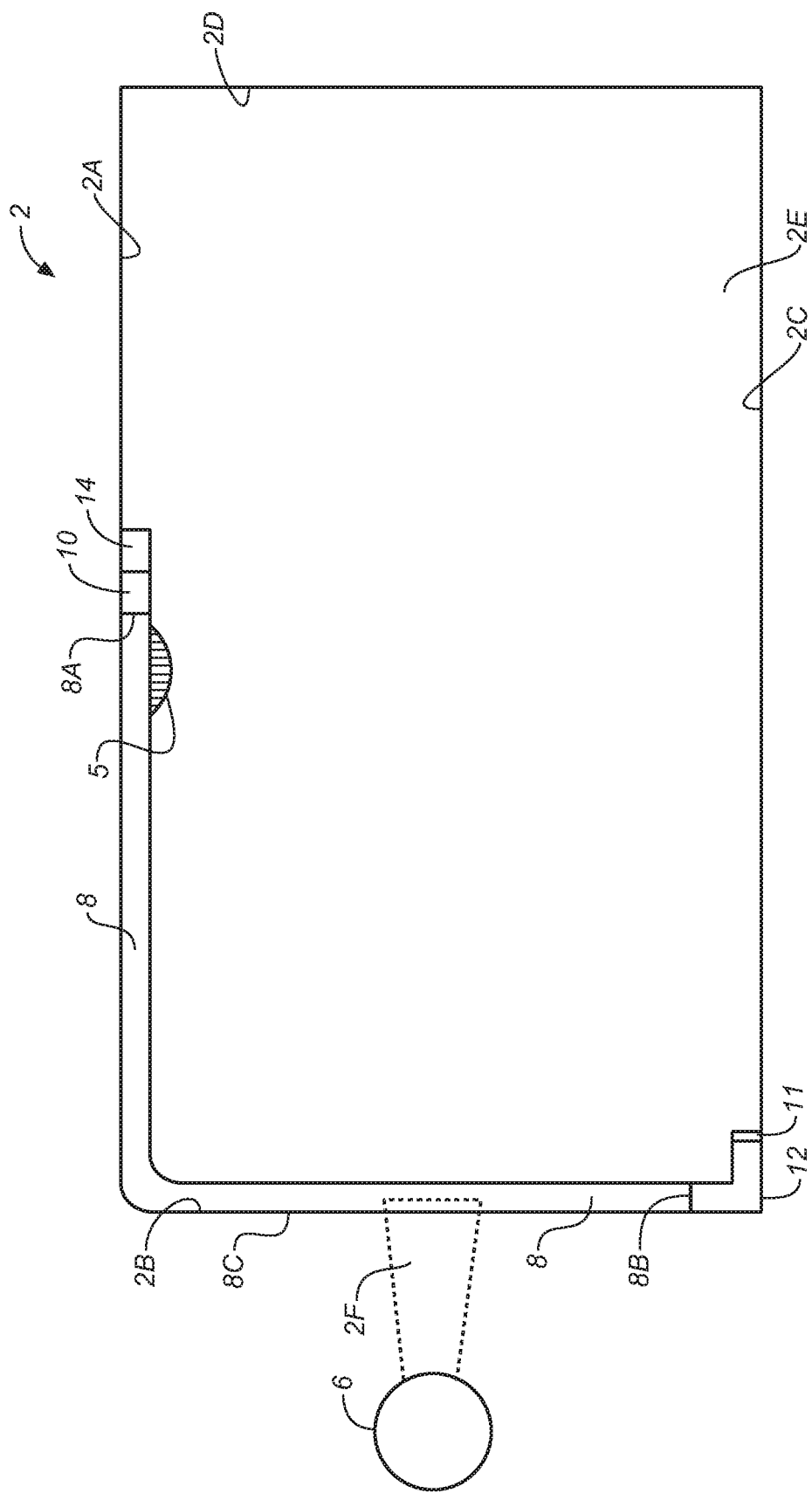
FIG. 1B is a plan view illustration of the first retrofit embodiment of the stray voltage detection system.
Figure 1C:
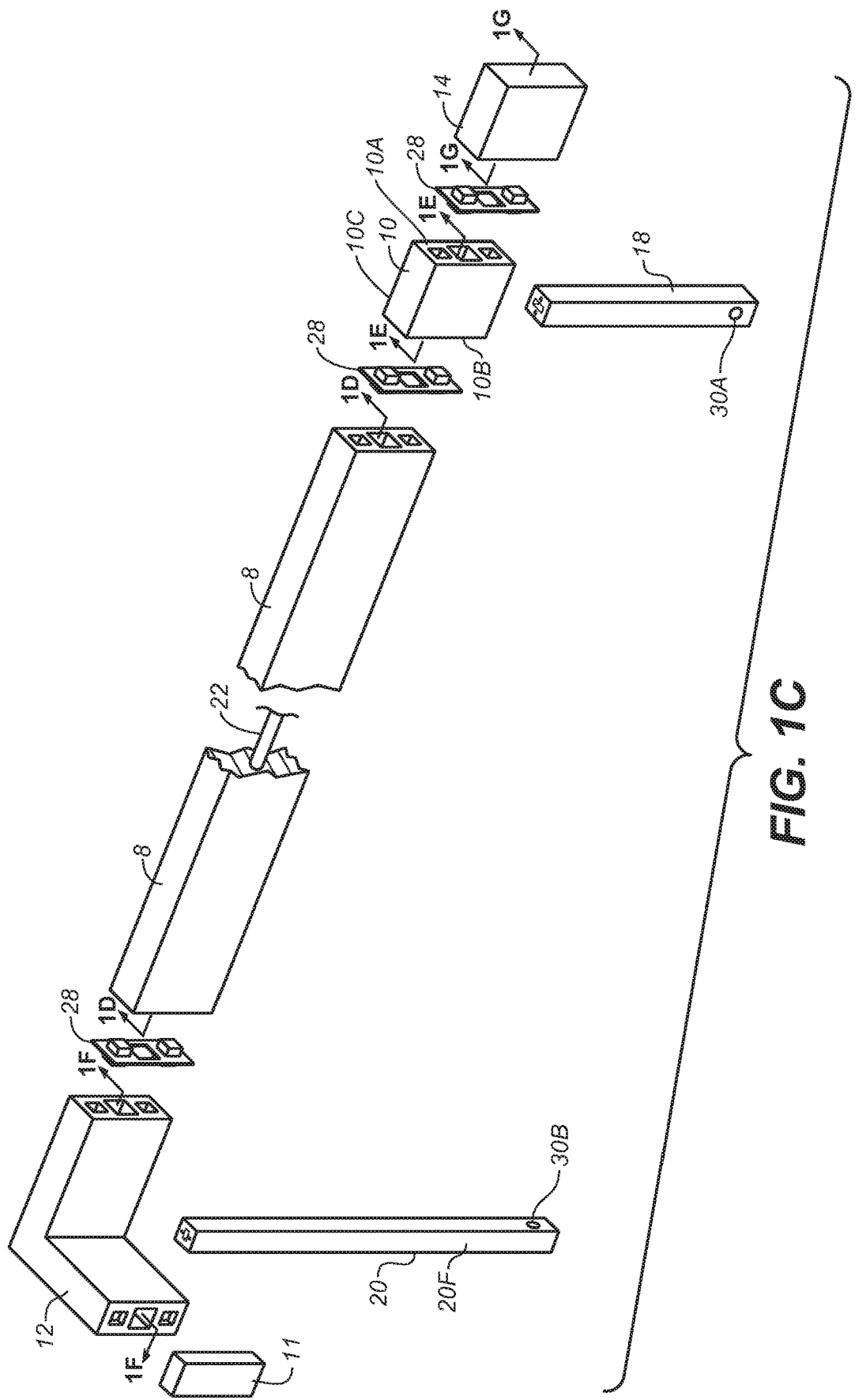
FIG. 1C is a perspective exploded view illustration of a voltage detection assembly of the first retrofit embodiment of the stray voltage detection system.
Figure 1D:
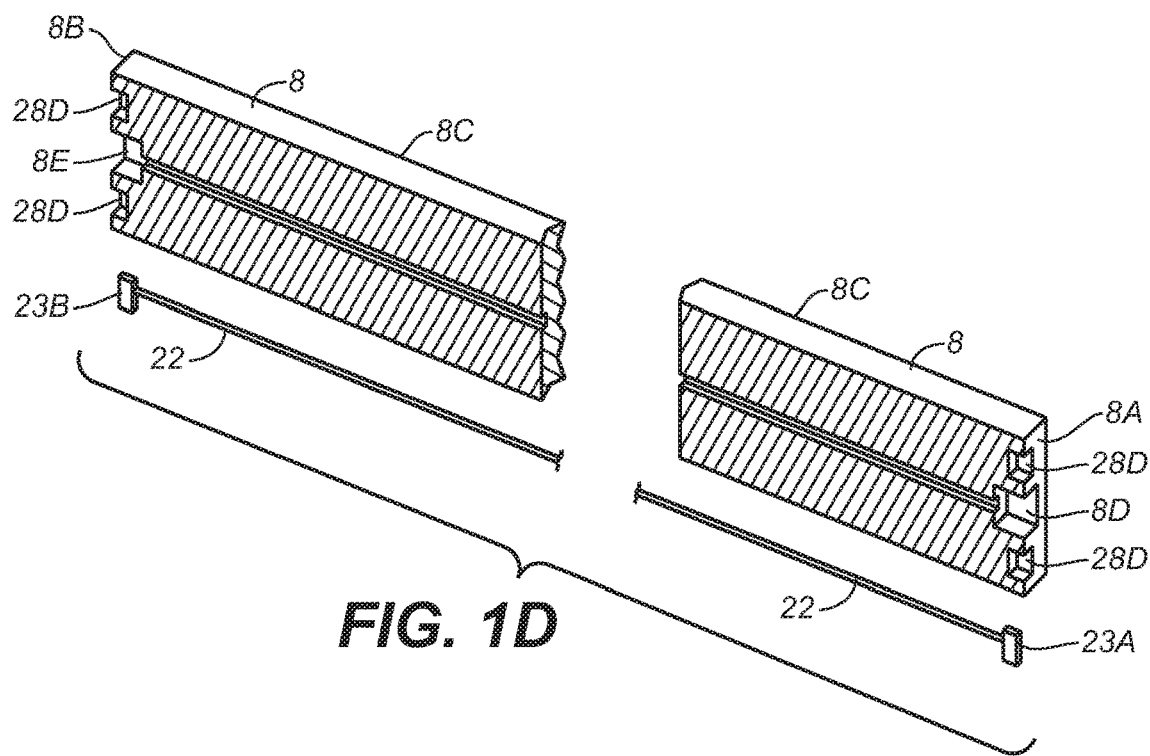
Figure 1G:
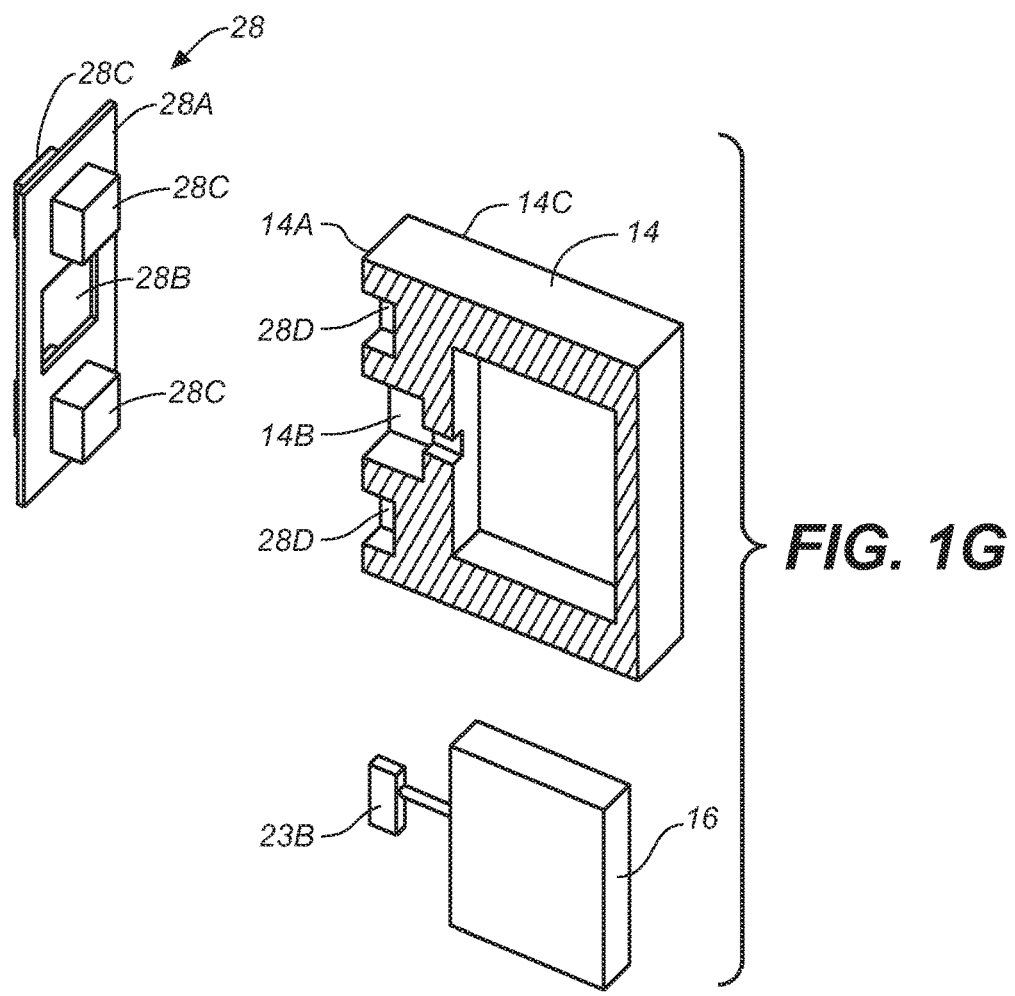
Figure 1E:
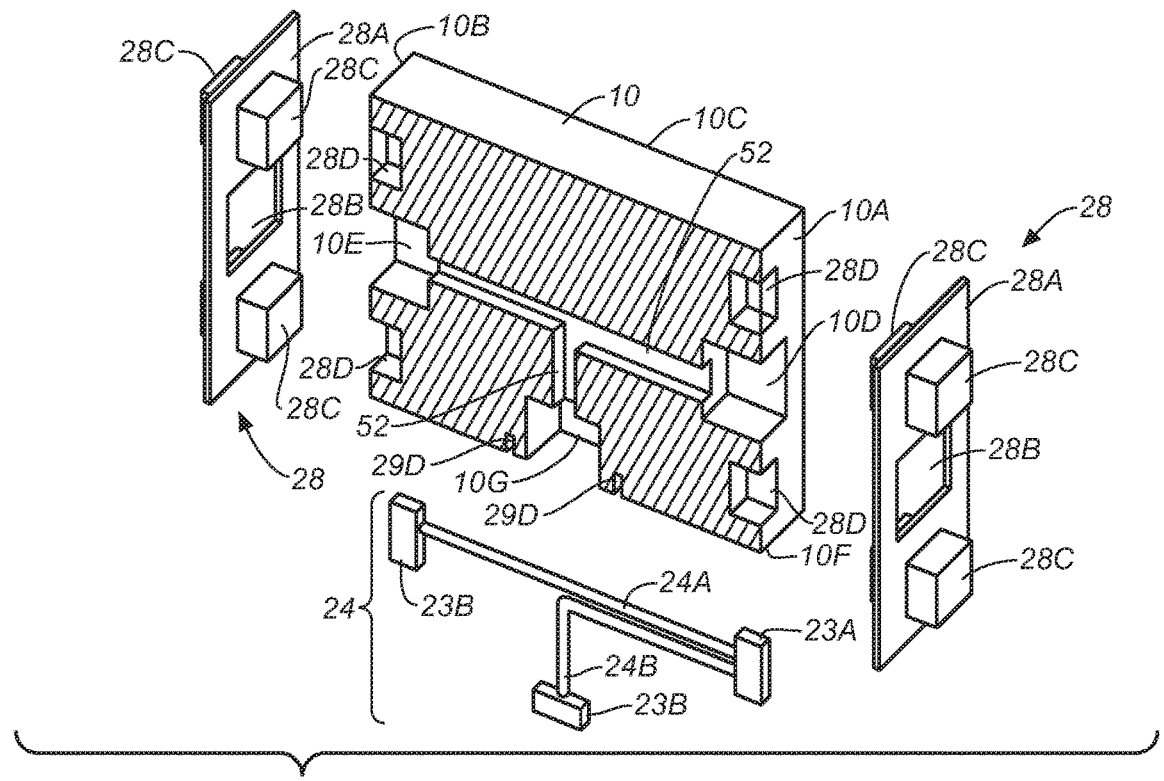

As best illustrated in FIG. 1C and FIG. 1E, the first junction module 10 has the same rectangular cross-sectional shape as the elongate module 8, with first junction module 10 having module opposing ends, 10A and 10B, and with the module opposing ends, 10A and 10B, containing module cavities 10D and 10E, respectively. The first junction module 10 also has a module bottom end 10F that contains a module cavity 10G. And, the first junction module 10 has an elongate flat side 10C for use in attaching the first junction module 10, as shown in FIG. 1A, to pool wall 2A of Pool 2. A "T" junction 24, which is electrically conductive, is embedded within the first junction module 10, preferably using an overmolding process. The "T" junction 24 comprises a wire segment 24A that extends between module opposing ends, 10A and 10B, of the first junction module 10, with an end of the wire segment 24A disposed within module cavity 10D of the first junction module 10 and the other end of the wire segment 24A disposed within module cavity 10E of the first junction module 10. The "T" junction 24 also comprises a wire segment 24B that extends between module bottom end 10F of the first junction module 10 and module end 10A of the first junction module 10, with an end of wire segment 24B disposed within module cavity 10G of the first junction module 10 and the other end of the wire segment 24B disposed within module cavity 10D of first junction module 10. A male electrical connector 23A is attached to the end of wire segment 24A that is disposed within module cavity 10D of the first junction module 10, thereby connecting the male electrical connector 23A to wire segment 24A, and a female electrical connector 23B is attached to the end of wire segment 24A that is disposed within module cavity 10E of the first junction module 10, thereby connecting the female electrical connector 23B to wire segment 24A. And, a female electrical connector 23B is attached to the end of wire segment 24B that is disposed within module cavity 10G of the first junction module 10, thereby connecting the female electrical connector 23B to wire segment 24B, with the other end of wire segment 24B attached to the male connector 23A disposed within cavity 10D of the first junction module 10.

Figure 1F:
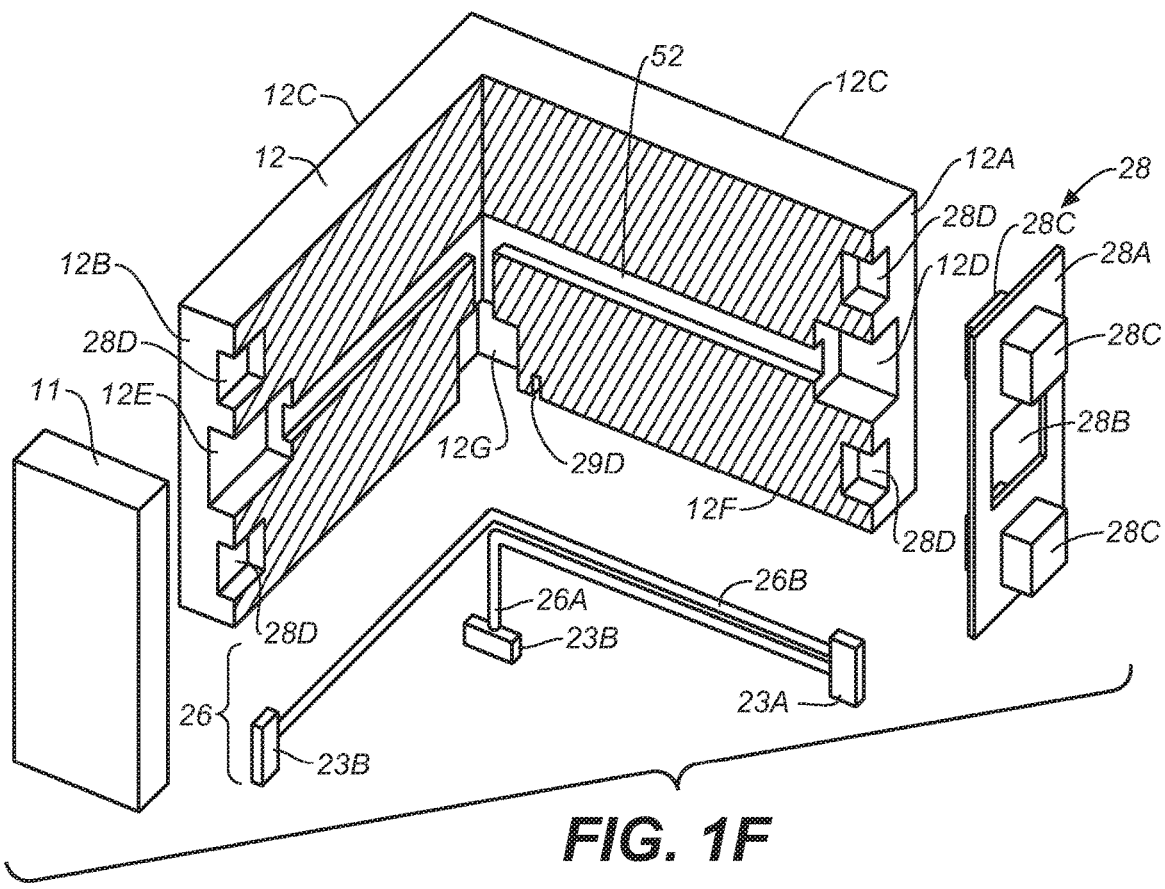

As best shown in FIG. 1C and FIG. 1F, the first angled junction module 12 has an angular shape with a pair of module legs forming a right angle, with each module leg having the same rectangular cross-sectional shape as the elongate module 8. The first angled junction module 12 has module opposing ends, 12A and 12B, at corresponding ends of the pair of module legs, and with module opposing ends, 12A and 12B, containing module cavities, 12D and 12E, respectively. The first angled junction module 12 also has a module bottom end 12F that contains a module cavity 12G at the intersection of the pair of module legs integral with the first angled junction module 12. And, similar to elongate module 8, each leg of the first angled junction module 12 has an outside flat side 12C for attaching the first angled junction module 12 to a vertical corner section of the Pool 2 formed by the intersection of the pool sides, 2B and 2C, of the Pool 2. An angled "T" junction 26, which is electrically conductive, is embedded in within the first angled junction module 12, preferably utilizing an overmolding process. A wire segment 26A extends between module bottom end 12F of the first angled junction module 12 and the module end 12A of the first angled junction module 12, with an end of wire segment 26A disposed within module cavity 12G of the first angled junction module 12, and the other end of the wire segment 26A disposed within cavity 12D of the first angled junction module 12. A male electrical connector 23A is attached to the end of wire segment 26A that is disposed within module cavity 12D of the first angled junction module 12, thereby connecting the male electrical connector 23A to wire segment 26A, and a female electrical connector 23B is attached to the end of wire segment 26A that is disposed within module cavity 12G of the first angled junction module 12, thereby connecting the female electrical connector 23B to wire segment 26A. Although not utilized in this first retrofit embodiment, the angled "T" junction 26 also comprises a wire segment 26B that extends between opposing ends, 12A and 12B, of the first angled junction module 12, with an end of the wire segment 26B disposed within module cavity 12D of the first angled junction module 12 and the other end of the wire segment 26B disposed within module cavity 12E of the first angled junction module 12. The male electrical connector 23A that is attached to wire segment 26A is also attached to the end of wire segment 26B that is disposed within module cavity 12D of the first angled junction module 12, thereby connecting the male electrical connector 23A to wire segment 26B, and a female electrical connector 23B is attached to the end of wire segment 26B that is disposed within module cavity 12E of the first angled junction module 12, thereby connecting the female electrical connector 23B to wire segment 26B. As discussed below, the wire segment 26B is utilized in completing electrical connections that define an electrical conductive element E4 in connection with a second retrofit embodiment.

The first junction module 10 and first angled junction module 12 are releasably connected to elongate module 8 by connecting the module end 10B of first junction module 10 to module end 8A of elongate module 8, and similarly connecting the module end 12A of first angled junction module 12 to the module end 8B of elongate module 8. These connections are facilitated by utilizing a pair of module joiners 28. Each module joiner out of the pair of module joiners 28 has a generally "H" shape, with each module joiner having a flat element 28A, with an opening 28B through the center of the flat element 28A, with a pair of legs 28C integral with each side of the flat element 28A, and with the flat element 28A having the same rectangular cross-sectional shape as the elongate module 8. A module joiner out of the pair of module joiners 28 is disposed between the module end 10B of first junction module 10 and the module end 8A of elongate module 8, with a pair of legs 28C of said module joiner 28 releasably secured within a corresponding pair of receptacle openings 28D within the module end 10B of the first junction module 10, and with the other pair of legs 28C of said module joiner 28 releasably secured within a corresponding pair of receptacle openings 28D within the module end 8A of said elongate module 8. The other module joiner out of the pair of module joiners 28 is disposed between the module end 12A of first angled junction module 12 and the module end 8B of elongate module 8, with a pair of legs 28C of said module joiner 28 releasably secured within a corresponding pair of receptacle openings 28D within the module end 12A of the first angled junction module 12, and with the other pair of legs 28C of said module joiner 28 releasably secured within a corresponding pair of receptacle openings 28D within the module end 8B of the elongate module 8.

The wire segment 22 embedded within the elongate module 8, is releasably connected to the "T" junction 24 embedded within the first junction module 10 and to the angled "T" junction 26 embedded within the first angled junction module 12, as illustrated FIG. 1C, FIG. 1E and FIG. 1F. Specifically, the male electrical connector 23A, integral with the wire segment 22, is releasably connected to the female electrical connector 23B, that is integral with the wire segment 24A that is integral with the "T" junction 24, thereby forming a first electrically wired connection between the wire segment 22 and the wire segment 24A; and the female electrical connector 23B, integral with the wire segment 22, is releasably connected to the male electrical connector 23A, that is integral with the wire segment 26A that is, in turn, integral with the angled "T" junction 26, thereby forming a second electrically wired connection between the wire segment 22 and the wire segment 26A. And, the first electrically wired connection is disposed within the opening 28B through the module joiner 28 that releasably connects the elongate module 8 to the first junction module 10, and the second electrically wired connection is disposed within the opening 28B through the module joiner 28 that releasably connects the elongate module 8 to the first angled junction module 12.

Figures 1H, 1I, 1J, 1K:
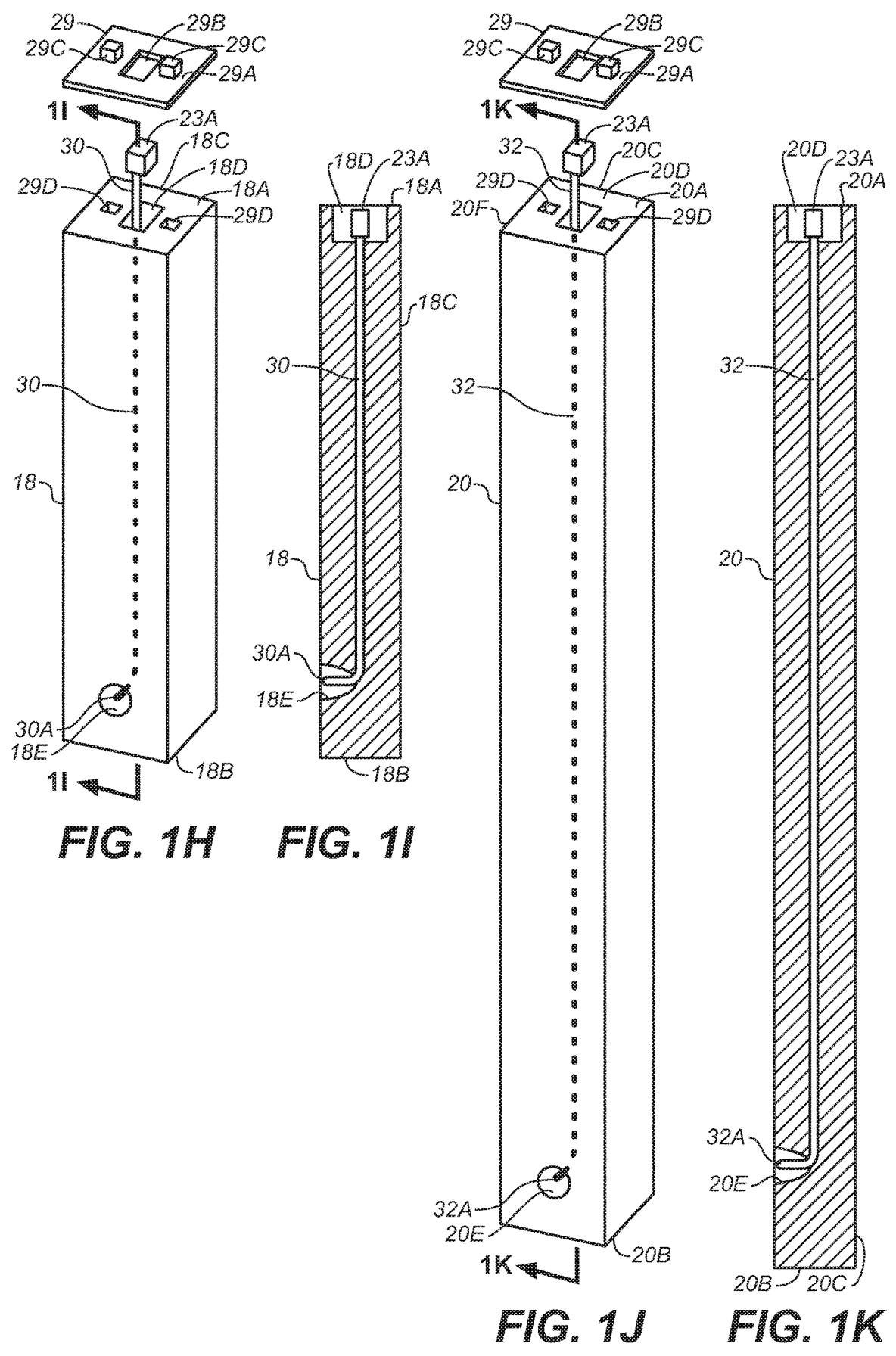

The first elongate electrode module 18, as illustrated in FIG. 1C, FIG. 1H, and FIG. 1I, preferably has a square cross-sectional shape, with the first elongate electrode module 18 having a module top end 18A and an opposite module bottom end 18B, and with the module top end 18A containing a module cavity 18D. The first elongate electrode module 18 also has an elongate flat side 18C for use in attaching the first elongate electrode module 18, as shown in FIG. 1A, to pool wall 2A of Pool 2. A wire segment 30, which is partially insulated and electrically conductive, is embedded within the first elongate electrode module 18, preferably utilizing an overmolding process. An end of the wire segment 30 extends into the module cavity 18D of the first elongate electrode module 18, with a male electrical connector 23A attached to end of the wire segment 30. The other end of the wire segment 30, which is not insulated, is disposed through an opening 18E within the module bottom end 18B, thereby forming a detector electrode end 30A that is in contact with the environment outside of the first elongate electrode module 18 and, specifically, in contact with pool water when the Pool 2 contains water. Similarly, as illustrated in FIG. 1C, FIG. 1.1 and FIG. 1K, the elongate electrode module 20 preferably has a square cross-sectional shape, with the elongate electrode module 20 having end a module top end 20A and an opposite module bottom end 20B, and with the module top end 20A containing a module cavity 20D. The elongate electrode module 20 also has elongate flat sides 20C for use in attaching the elongate electrode module 20, as shown in FIG. 1A, to a corner of the Pool 2 where pool walls 2B and 2C intersect. A wire segment 32, which is insulated and electrically conductive, is embedded within the elongate electrode module 20, preferably utilizing an overmolding process. An end of the wire segment 32 extends into the module cavity 20D of the elongate electrode module 20, with a male electrical connector 23A attached to the end of the wire segment 20. The other end of the wire segment 32, which is not insulated, is disposed through an opening 20E within the module bottom end 20B, thereby forming a reference electrode end 32A that is in contact with the environment outside of the elongate electrode module 20 and, specifically, in contact with pool water when the Pool 2 contains water. And, in a preferred embodiment, the elongate first elongate electrode modules, 18 and 20, are flexible and can be made of plastic or any similar flexible material that is not electrically conductive. With respect to the description of an end of wire segments 30 and 32 as a detector electrode end 30A and reference electrode end 32A, respectively, the differential nomenclature for the electrode ends is only for distinguishing, as described below, different positions for the detector and reference electrode ends within the Pool 2.

The first elongate electrode module 18 is releasably connected to the first junction module 10 by connecting the module bottom end 10F of the first junction module 10 to module top end 18A of first elongate electrode module 18. This connection is facilitated by utilizing a module joiner 29, with the module joiner 29 having a flat element 29A, with an opening 29B through the center of the flat element 29A, with a pair of legs 29C integral with each side of the flat element 29A, and with the flat element 29A having the same square shape as the first elongate electrode module 18. The module joiner 29 is disposed between the module bottom end 10F of the first junction module 10 and the module top end 18A of first elongate electrode module 18, with a pair of legs 29C of said module joiner 29 releasably secured within a corresponding pair of receptacle openings 29D within the module bottom end 10F of the first junction module 10, and with the other pair of legs 29C of said module joiner 29 releasably secured within a corresponding pair of receptacle openings 29D within the module top end 18A of said first elongate electrode module 18. In a similar fashion the elongate electrode module 20 is releasably connected to the first angled junction module 12 by connecting the module bottom end 12F of the first angled junction module 12 to module top end 20A of elongate electrode module 20. This connection is facilitated by utilizing a module joiner 29, which is disposed between the module bottom end 12F of the first angled junction module 12 and the module top end 20A of elongate electrode module 20, with the pair of legs 29C of said module joiner 29 releasably secured within a corresponding pair of receptacle openings 29D within the module bottom end 12F of the first angled junction module 12, and with the other pair of legs 29C of said module joiner 29 releasably secured within a corresponding pair of receptacle openings 29D within the module top end 20A of said elongate electrode module 20.

The wire segment 30, embedded within the first elongate electrode module 18, is releasably connected to the "T" junction 24 embedded within the first junction module 10, as illustrated in FIG. 1C, FIG. 1E, FIG. 1H and FIG. 1I, Specifically, the male electrical connector 23A, integral with the wire segment 30, is releasably connected to the female electrical connector 23B, that is integral with the wire segment 24B that is integral with the "T" junction 24, thereby forming an electrically wired connection between the wire segment 30 and the wire segment 24B. And, said electrically wired connection is disposed within the opening 29B through the module joiner 29 that releasably connects the first elongate electrode module 18 to the first junction module 10. Similarly, as shown in FIG. 1C, FIG. 1F, FIG. 1.1, and FIG. 1K, the wire segment 32 embedded within the elongate electrode module 20, is releasably connected to the "T" junction 26 embedded within the first angled junction module 12, as illustrated in the exploded views of FIG. 1C through FIG. 1F. Specifically, the male electrical connector 23A, integral with the wire segment 32, is releasably connected to the female electrical connector 23B, that is integral with the wire segment 26B that is integral with the "T" junction 26, thereby forming an electrically wired connection between the wire segment 32 and the wire segment 26B. And, said electrically wired connection is disposed within the opening 29B through the module joiner 29 that releasably connects the elongate electrode module 20 to the first angled junction module 12.

The transmission module 14, as illustrated in FIG. 1C and FIG. 1G, preferably has a rectangular cross-sectional shape, with a module end 14A containing a module cavity 14B and a pair of receptacle cavities 28D positioned on opposite sides of the module cavity 14B. The transmission module 14 also has an elongate flat side 14C for use in attaching the transmission module 14, as shown in FIG. 1A, to pool wall 2A of Pool 2. The transmission module 14 is releasably connected to the first junction module 10 by utilizing a module joiner 28, having the same structure described above with respect to the connection of the elongate module 8 to the first junction module 10 and the first angled module 12. The module joiner 28 is disposed between the module end 14A of the transmission module 14 and the module end 10A of junction module 10, with a pair of legs 28C of said module joiner 28 releasably connected to the pair of receptacle cavities 28D within open module end 14A of the transmission module 14, and with the other pair of legs 28D of said module joiner 28 releasably connected to a pair of receptacle cavities 28D within the open module end 10A of the first junction module 10.

As schematically illustrated in FIG. 2, the wired electrical connections within the voltage detection assembly 4, described above, define a pair of elongate conductive elements consisting of: 1) a first elongate conductive element E1 having a detector electrode end and a connecting end; and 2) a second elongate conductive element E2 having a reference electrode end and a connecting end. Functionally, the first elongate conductive element E1 is for transmitting a first analog signal between the detector electrode end and its associated connecting end, and the second elongate conductive element E2 is for transmitting a second analog signal between the reference electrode end and its associated connecting end, which is connected to the wireless transmitter 16 as described below. More, specifically, the first analog signal is transmitted between: 1) the detector electrode end 30A of electrode wire 30, which is embedded within first elongate electrode module 18; and 2) the male connecter 23A attached to wire segment 24B disposed within "T" junction 24 embedded within junction module 10, with the male connector 23A forming the connecting end for attachment to the wireless transmitter 16. And, the second analog signal is transmitted between: 1) the reference electrode end 32A of electrode wire 32, embedded within the first elongate electrode module 20; and 2) the male connecter 23A attached to wire segment 24A disposed within "T" junction 24 embedded within junction module 10, with the male connector 23A forming the connecting end for attachment to the wireless transmitter 16.

Figure 3:
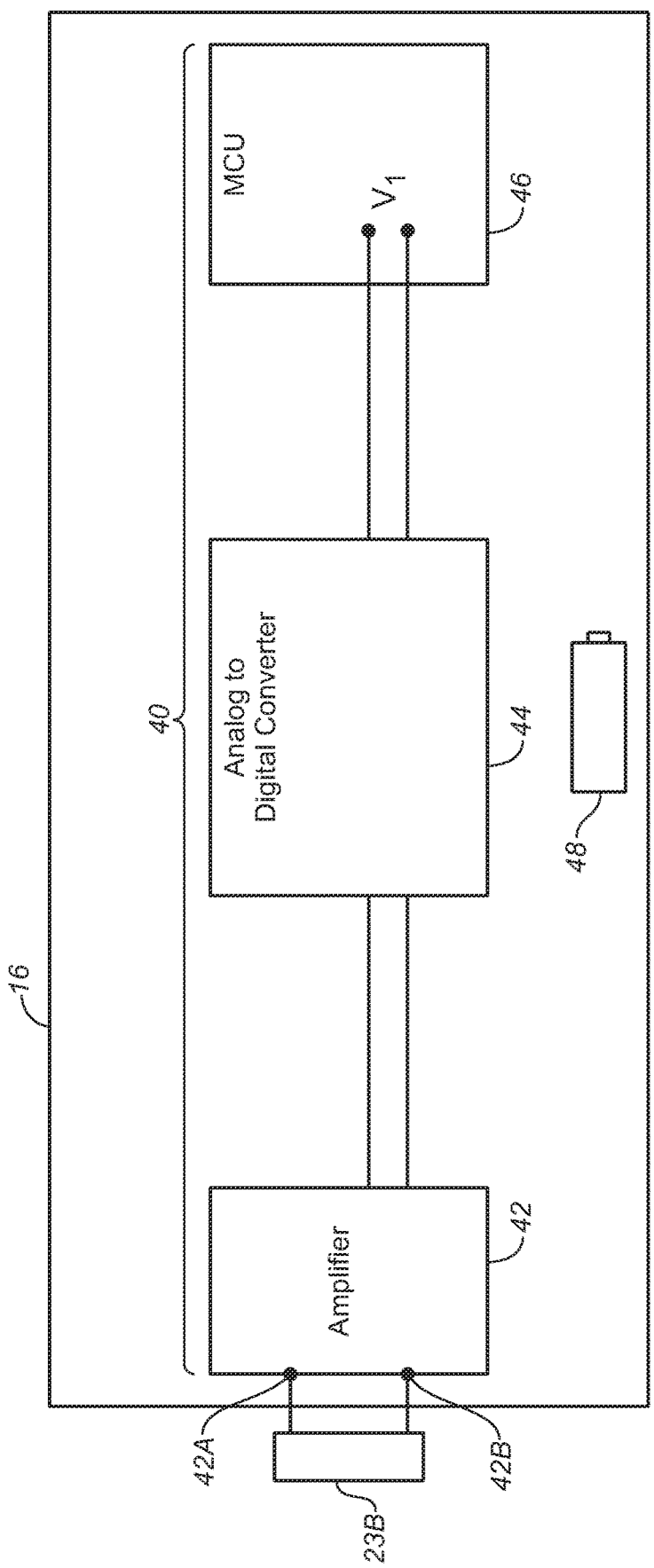
FIG. 3 is a schematic diagram illustrating a wireless transmitter unit of the voltage detection assembly of the first retrofit embodiment of the stray voltage detection system.

The wireless transmitter unit 16, disposed within the transmission module 14, contains a wireless transmitter circuit 40, as illustrated in FIG. 3, for receiving first and second analog signals from corresponding first and second first and second conductive elements, E1 and E2, within the voltage detection assembly 4. More specifically, the wireless transmitter circuit 40 comprises: 1) a pair of terminals 42A and 42B in electrical connection with a female electrical connector 23B, which is releasably connected to the male electrical connector 23A integral the "T" junction 24 embedded within junction module 10, thereby completing the connection of the first and second elongate conductive elements, E1 and E2, to the wireless transmitter unit 16; 2) an amplifier 42 in electrical connection with the pair of terminals 42A and 42B, with the amplifier 42 for receiving and amplifying the first and second analog signals; 3) an analog-to-digital converter 44 in electrical connection with the amplifier 42, with the analog-to-digital converter 44 for converting the first and second amplified analog signals to first and second digital signals, respectively; 4) a microcontroller unit 46 in electrical connection with the analog-to digital converter 44, with the microcontroller unit 46 enabled for: a) converting the first and second digital signals to a voltage value signal V1, which represents the voltage between: the detector electrode end 30A of elongate wire 30 disposed within first elongate electrode module 18; and the reference electrode end 32A of elongate wire 32 disposed within first elongate electrode module 20; and b) wirelessly sending the voltage value signal V1 to a wireless receiver unit 50 within the wireless receiver housing 6B integral with the retrofit skimmer lid 6; and 5) a battery 48 for supplying electrical power to the electrical components within wireless transmitter circuit 40.

Figure 4:
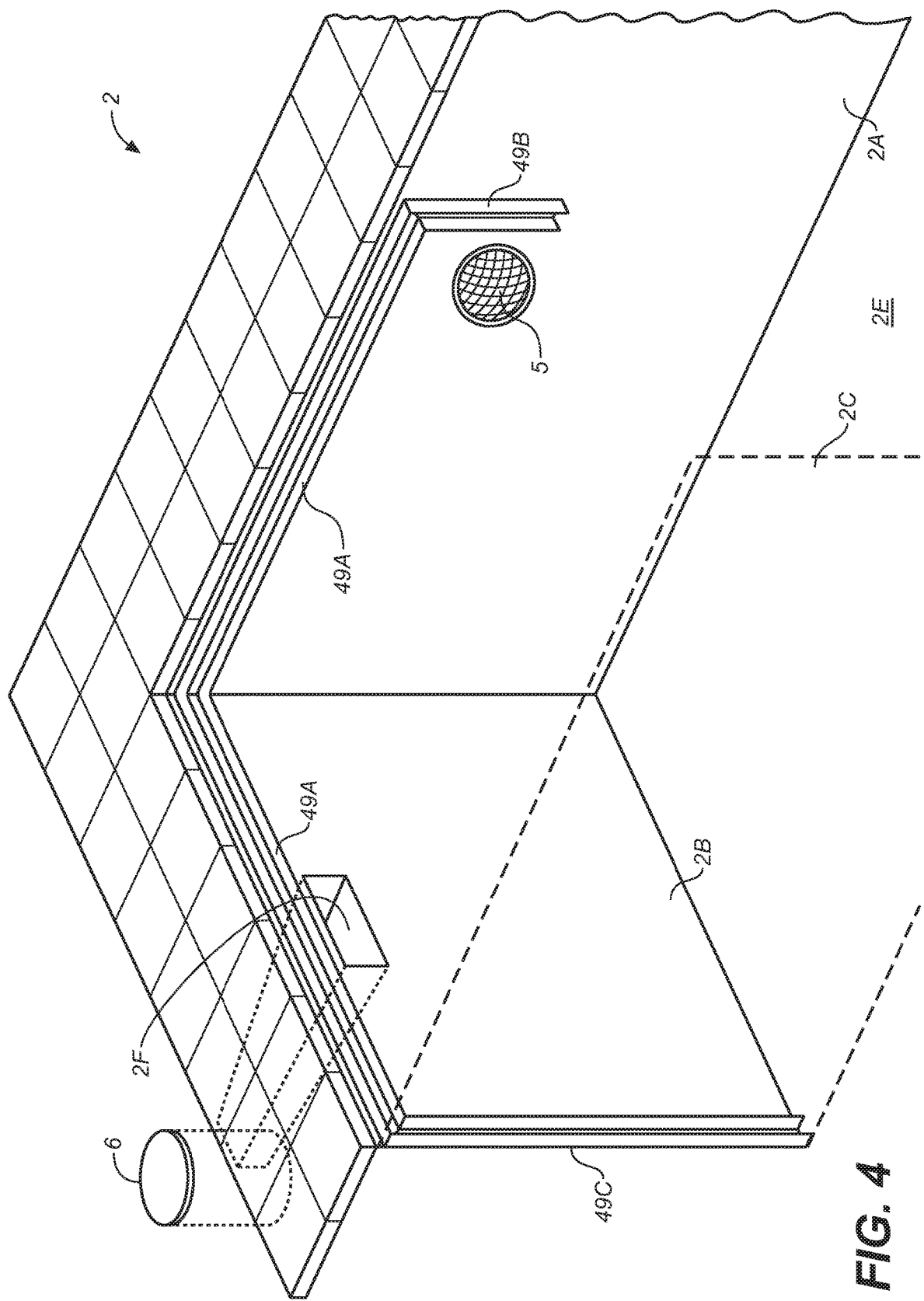
FIG. 4 is a perspective view illustration of a plurality of channels for attaching the voltage detection assembly (not shown) to adjacent pool walls of the pool.

The voltage detection assembly 4, as described above, is used to retrofit the Pool 2 by attaching the voltage detection assembly 4 to the Pool 2 by preferably utilizing double-sided tape for underwater applications, such as VHB Tape from 3M. The tape is placed on the elongate flat side 8C of the elongate module 8; the elongate flat sides 10C and 12C of the junction module 10 and angled junction module 12, respectively; the elongate flat side 14C of transmission module 14; and the elongate flat sides 18C and 20C of first elongate electrode modules, 18 and 20, respectively. The voltage detection assembly 4 is releasably attached to the inside surface of pool walls 2A and 2B and to the intersection of pool walls 2B and 2C of the Pool 2 by pressing the voltage detection assembly 4 against the surface of the walls. In another embodiment, rather than use the double-sided tape to attach the voltage detection assembly 4 to the Pool 2, a series of channels, 49A, 49B and 49C, as illustrated in FIG. 4 are attached to the inside surfaces of pool walls 2A and 2B, utilizing concrete screws or similar attachment methods. Each channel has a generally "U" shaped cross-section that is sized so as to allow the various modules that comprise the voltage detection assembly 4 to be releasably secured within a corresponding channel. Channel 49A secures the elongate module 8, first junction module 10, first angled junction module 12 and transmission module 14 to the pool walls; and channels 49A and 49B secure the first elongate electrode modules, 18 and 20, to the pool walls.

It is a novel feature of the first retrofit embodiment of the stray voltage detection system, described above, that the Pool 2 is retrofitted by attaching the voltage detection assembly 4 of first retrofit embodiment to the Pool 2, as illustrated in FIG. 1A and FIG. 1B, such that the first elongate electrode module 18 and the first elongate electrode module 20 are preferably positioned on opposite and facing sides of the Pool 2, with the first elongate electrode module 18 positioned adjacent to the light fixture 5. And, it is most preferable that the first and second elongate electrode modules, 18 and 20, be positioned as far apart as practicable within the confines of the pool walls. More specifically, in the preferred embodiment the voltage detection assembly 4 of the first retrofit embodiment is used to retrofit the Pool 2 as follows: 1) attaching the elongate module 8 of the voltage detection assembly 4 to insides surfaces of pool walls 2A and 2B, and positioning elongate module 8 generally parallel to the top of said walls and above the pool water level of the Pool 2, with the junction module 10 positioned above the light fixture 5 and the angled junction module 12 positioned at the intersection of pool walls 2B and 2C; and 2) attaching the first elongate electrode module 18 in a generally vertical position on the inside surface of the pool wall 2A, with the detector electrode end 30A of the electrode wire 30, which is embedded within the first elongate electrode module 18, preferably positioned adjacent to and as close as practicable to the light fixture 5A; and 3) attaching the first elongate electrode module 20 in a generally vertical position to the inside surfaces of pool walls 2B and 2C, where those pool walls intersect. In this regard, the attachment of the first elongate electrode module 20 to the inside surfaces of pool walls 2B and 2C places a module side 20F of first elongate electrode module 20 adjacent to the pool wall 2C, which is opposite from and facing pool wall 2A. And, positioning the first elongate electrode module 20 within the corner of the Pool 2, where pool walls 2B and 2C intersect, places the first elongate electrode module 20 as far away as practicable, given the confines of the Pool 2, from the first elongate electrode module 18, which is adjacent to the light fixture 5. In this regard, for the Pool 2 having a rectangular shape and the light fixture 5 integral with pool wall 2A, the optimum position for the first elongate electrode module 20 will always be within either the corner of the Pool 2 formed by the intersection of pool wall 2C with pool wall 2B or the corner of Pool 2 formed by the intersection of pool wall 2C with pool wall 2D, with the optimum corner position determined by the position of the light fixture 5. And, as discussed in more detail below, the reference electrode end 32A integral with electrode wire 32, which is embedded within the first elongate electrode module 20, is positioned a predetermined distance below the level of the pool water of the Pool 2.

Figure 6A:
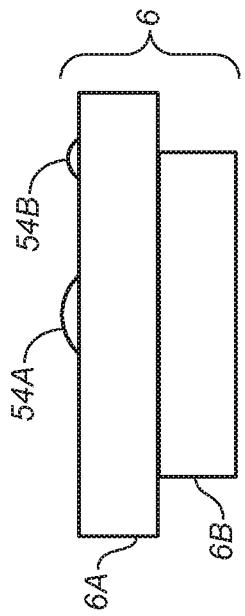
FIG. 6A and FIG. 6B are schematic diagrams of a side view and plan view, respectively, of a retrofitted pool skimmer lid of the first retrofit embodiment of the stray voltage detection system.
Figure 6B:
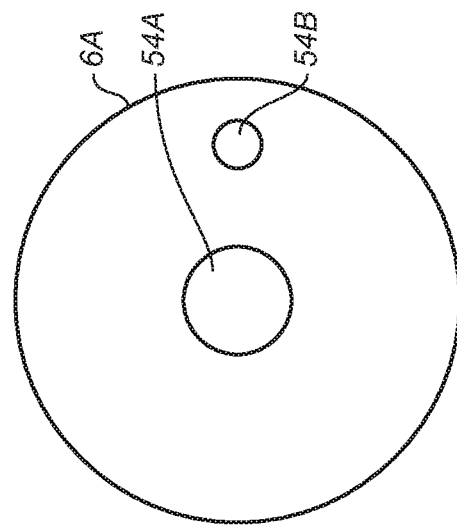
Figure 5:
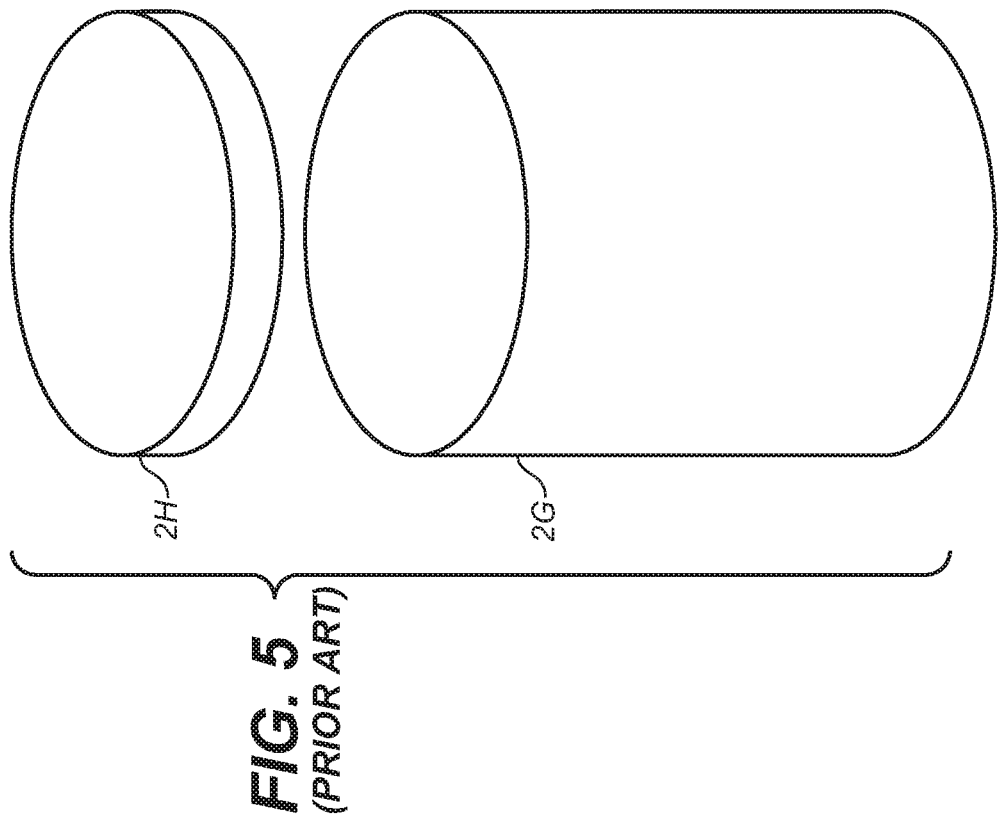
FIG. 5 is a perspective exploded view schematic diagram illustrating a prior art pool skimmer, showing a pool skimmer catch basin and pool skimmer lid.
Figure 7:
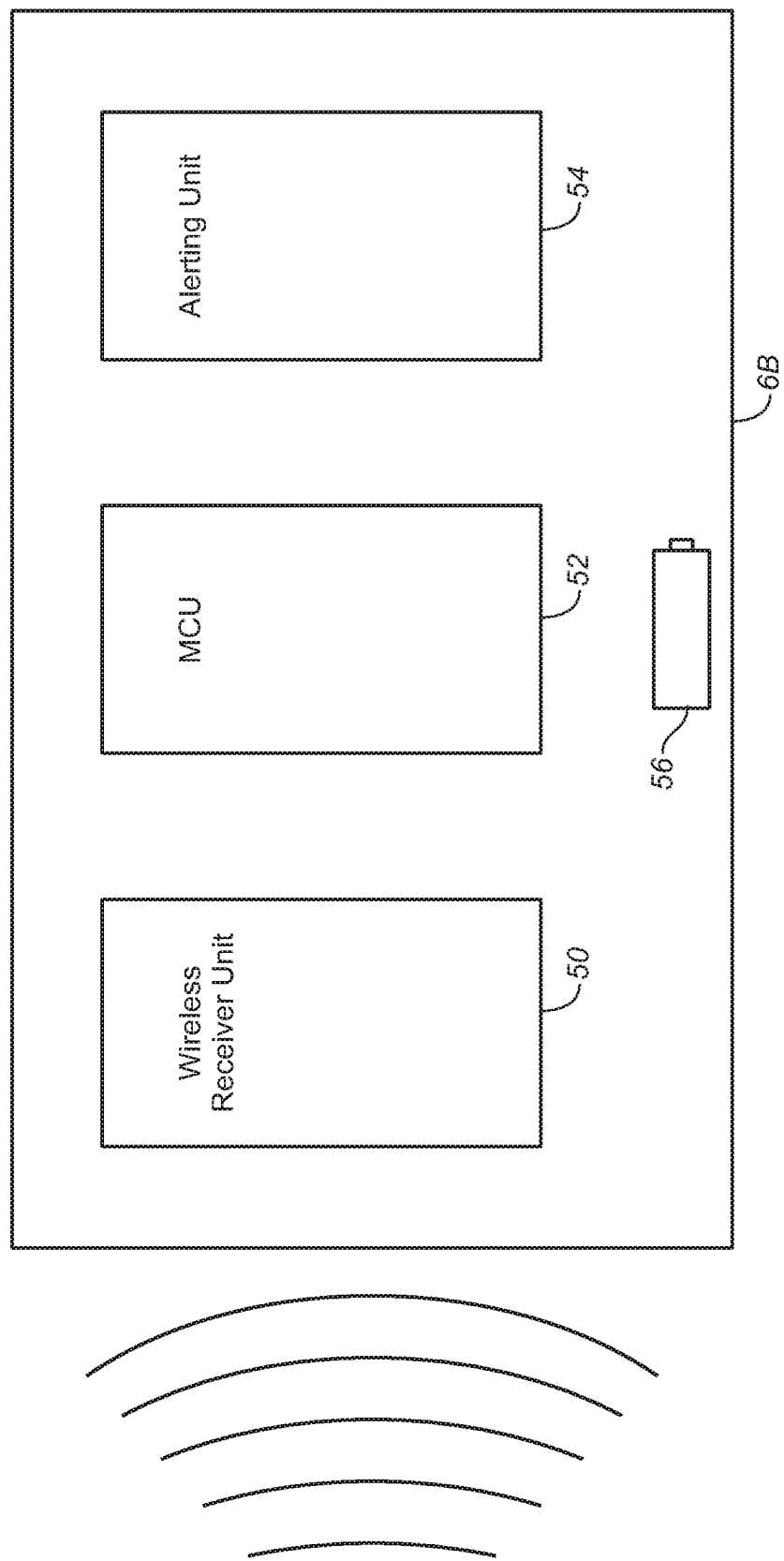
FIG. 7 is a schematic diagram of a wireless receiver unit of the first retrofit embodiment of the stray voltage detection system.

The retrofit skimmer lid 6 is a retrofitted skimmer lid for a swimming pool skimmer system used to skim debris from the surface of the pool water. The pool skimmer system collects the floating debris from pool water in a catch basin where the floating debris is skimmed off into a drain. In one embodiment of a pool skimmer system, pool water along with floating debris passes through a pool skimmer opening 2F through pool wall 2B, as shown in FIG. 1A, and then into a cylindrically shaped catch basin 2G as illustrated in prior art FIG. 5. A removable skimmer lid 2H is positioned on top of the catch basin 2G in order to prevent debris not coming from the pool water to enter the catch basin 2G. As shown in FIG. 6A and FIG. 6B, the retrofit skimmer lid 6, which replaces the removable skimmer lid 2H, comprises a retrofit lid 6A and a wireless receiver housing 6B that is preferably integral with the bottom side of retrofit lid 6A. More specifically, and as illustrated in FIG. 7, the wireless receiver housing 6B comprises: 1) a wireless receiver unit 50 disposed within the wireless receiver housing 6B, with the wireless receiver unit 50 for wirelessly receiving the voltage value signal V1 from the wireless transmission unit 16; 2) a microcontroller unit 52 in electronic communication with the wireless receiver unit 50, with the microcontroller unit 52 being programmed for determining whether the voltage value signal V1 is greater than a predetermined threshold voltage value; and 3) an alerting unit 54 in electronic communication with the microcontroller unit 52 for issuing one or more alerts to persons in the pool water or about to enter the pool water if the microcontroller unit 52 has determined that the voltage value signal V1 is, in fact, greater than the threshold voltage value, meaning that a harmful or life threatening stray voltage exists in the pool water of Pool 2. Sound and light generating devices, 54A and 54B, respectfully, are integral with the retrofit skimmer lid 6 and in electronic communication with the alerting unit 54. All electrical components integral with the retrofit skimmer lid 6 are powered by a battery 56 disposed within the wireless receiver housing 6B.

The voltage detection assembly 4 and retrofit skimmer lid 6 of the first retrofit embodiment are provided to efficiently and with the highest probability detect a dangerous stray electrical voltage in the pool water of the Pool 2, with the stray voltage arising due to a stray electrical current entering the pool water due to a malfunction of light fixture 5. In this embodiment and as describe above, the Pool 2 has a single light fixture 5 that is integral with the inside surface of pool wall 2A of the Pool 2, with the light fixture 5, as best illustrated in FIG. 1A and FIG. 1B, positioned approximately equidistant between the intersections of pool wall 2A with pool wall 2B and 2D, and further positioned below the level of the pool water, but closer to the level of the pool water than to the bottom side 2E of the Pool 2. In this regard, it is a novel and surprising advantage of this first retrofit embodiment of the voltage detection system that for each light fixture 5 within Pool 2 only a single voltage needs to be measured between a single pair of elongate electrode modules in order to provide a high probability that a dangerous stray voltage is detected in the pool water of Pool 2. Alternative systems that are intended to detect a stray voltage in a Pool 2 with a single light fixture by measuring multiple voltages between corresponding multiple pairs of elongate electrode modules would be more expensive and complicated to install, and without providing a higher probability of detecting the stay voltage. Specifically, this advantage of the first retrofit embodiment is accomplished by positioning the first elongate electrode module 18, out of the first pair of elongate electrode modules, adjacent to the pool wall 2A and the light fixture 5, and positioning elongate electrode module 20, out of the first pair of elongate electrode modules, adjacent to pool wall 2C and, most preferably, positioning the elongate electrode module 20 at the intersection of pool walls 2B and 2C, which positions the first elongate electrode module 20 as far away as practicable from the first elongate electrode module 18 given the rectangular shape of Pool 2. As noted above, it is preferable that the detector electrode end 30A of electrode wire 30, which is embedded within first elongate electrode module 18, is positioned adjacent to and as close as practicable to the light fixture 5. And, reference electrode end 32A integral with electrode wire 32, embedded within first elongate electrode module 20, is preferably positioned a predetermined distance below the level of the pool water of Pool 2. This "predetermined distance" is determined by positioning the reference electrode end 32A at a location that maximizes the linear distance between the reference electrode end 32A and detector electrode end 30A positioned adjacent to and as close as practicable to light fixture 5. In the example illustrated in FIG. 1A, the maximum linear distance between the detector and reference electrodes, 30A and 32A, is with the elongate electrode module 32 positioned, as described and illustrated above, within the corner of the Pool 2 formed by the intersection of pool walls 2B and 2C, and with the reference electrode end 32A positioned at the bottom of the intersection of pool walls, 2B and 2C. Positioning the detector and reference electrodes, 30A and 32A, in the manner described ensures that any stray voltage in the pool water of Pool 2 that is detected between the detector and reference electrodes, 30A and 32A, emanating from the light fixture 5, will be the highest voltage as compared to other voltages that might be detected at other locations in the pool water and, thus, provides the highest probability that a stay voltage will be successfully detected, as compared to the lower probability that a stray voltage will be detected if the detector and reference electrodes, 30A and 32A, are separated by a lesser distance.

Figure 8A:
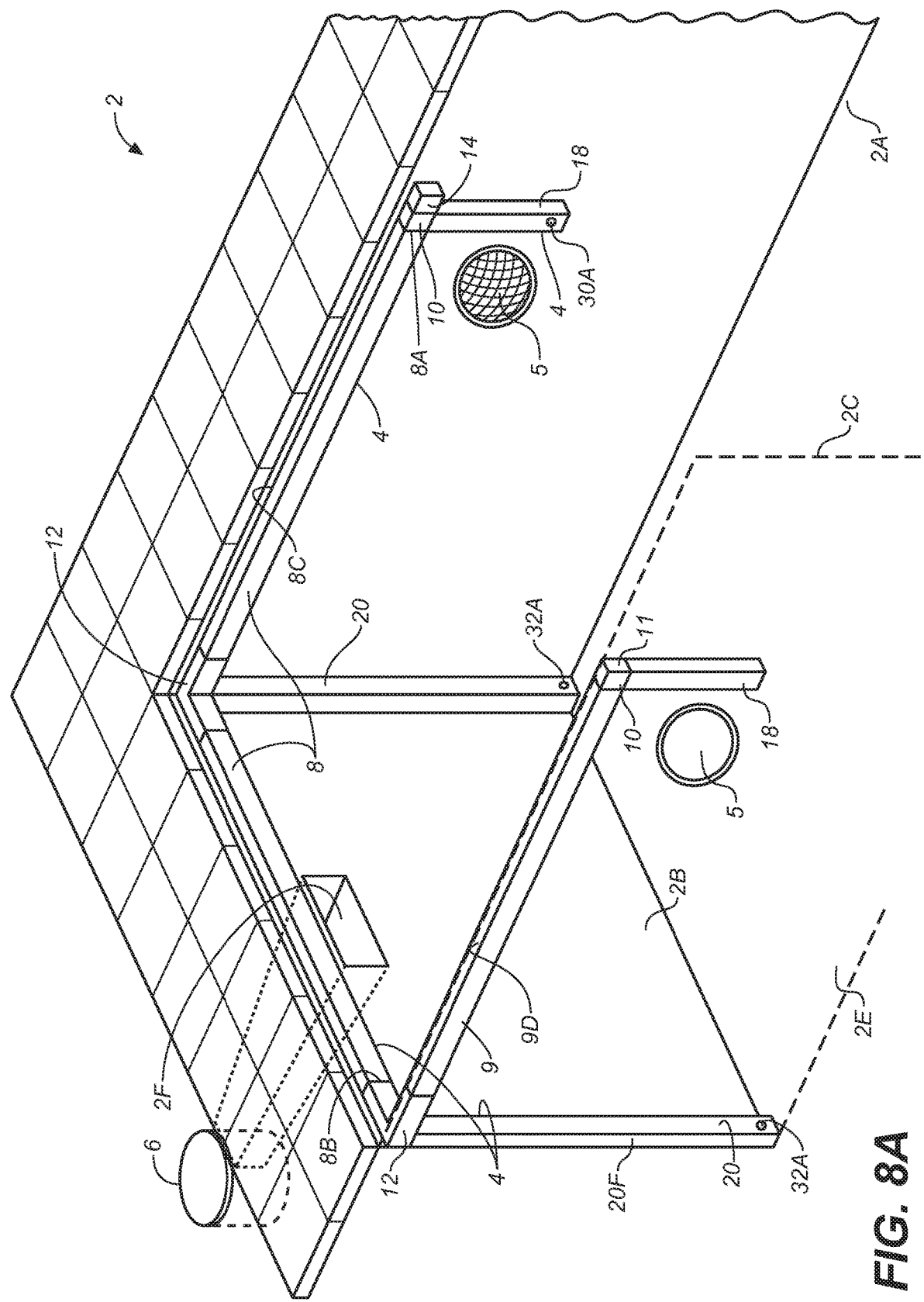
FIG. 8A is a perspective view illustration of a second retrofit embodiment of a stray voltage detection system for a rectangularly shaped pool having a pair of electrical fixtures integral with opposite pool walls.

FIG. 8A and FIG. 8B illustrate a second retrofit embodiment of a stray voltage detection system for retrofitting the Pool 2 having a rectangular shape (hereinafter referred to as the "second retrofit embodiment"), with Pool 2 having an additional light fixture 5A. The second retrofit embodiment has many of the same structural components as the voltage detection assembly 4 of first retrofit embodiment described above, but comprises additional structural components related to the fact that the second retrofit embodiment has an additional light fixture 5 integral with the pool wall 2C of Pool 2. In this embodiment, the second light fixture 5 is positioned at the midpoint between the intersection of pool walls 2C and 2B and the intersection of pool walls 2C and 2D, and further positioned below the level of the pool water, but closer to the level of the pool water than to the pool bottom 2E of the Pool 2. In the second retrofit embodiment, the voltage detection assembly 4 differs, in part, from the voltage detection assembly 4 of the first retrofit embodiment in the following respects: The elongate module 8 is separated into first and second elongate modules 8, with an end of the first elongate module 8 connected to the first junction module 10 in the manner described above in connection with the first retrofit embodiment pertaining to the attachment of elongate module 8 to the first junction module 10, and with an end of the second elongate module 8 connected to the first angled junction module 12 as also describe above in connection with the first retrofit embodiment with respect to the attachment of elongate module 8 to the first angled junction module 12. A second angled junction module 12, having same structure as the first angled junction module 12 and containing an electrically conductive "T' junction 26 just like the first angled junction module 12, is releasably connected to the opposite ends of the first and second elongate module 8, respectively, as described above in connection with the first retrofit embodiment pertaining to the attachment of elongate module 8 to the second angled junction module 12. And, a second elongate electrode module 20 out of a second pair of elongate electrode modules, having the same structure as the first elongate electrode module 20 out of the first pair of elongate modules, is releasably connected to the second angled junction module 12 in the same manner as described above in connection with the first retrofit embodiment pertaining to the attachment of the first elongate electrode module 20 to the first angled junction module 12.

The voltage detection assembly 4 of the second retrofit embodiment also comprises: an elongate module 9; a second junction module 10; and a second elongate electrode module 18 out of the second pair of elongate electrode modules. The elongate module 9 has the same structure and rectangular cross-sectional shape as the elongate module 8, with the components parts of elongate module 9 having the same identification numbers as those pertaining to elongate module 8, but elongate module 9 may have a different length than elongate module 8. And, the second junction module 10 and second elongate electrode module 18 have the same structures and square cross-sectional shapes as the first junction module 10 and the first elongate electrode module 18, with the component parts of the second junction module 10 and second elongate electrode module 18 having the same identification numbers as those pertaining to the first junction module 10 and first elongate electrode module 18. As a result, the descriptions above relating to the first junction module 10 and first elongate electrode module 18, including the placement of the detector electrode end 30A adjacent to and as close as practicable to the second light fixture, are equally applicable to the second junction module 10 and second elongate electrode module 18. The only differences are that the module end 10E3 of the second junction module 10 is releasably connected to the elongate module 9, rather than connected to elongate module 8; and there is no transmission module 14 connected to the module end 10A of the second junction module 10, rather an end cap 11 is releasably connected to module end 10A of the second junction module 10.

As schematically illustrated in FIG. 9, the electrical connections within the voltage detection assembly 4 described above in connection with the second retrofit embodiment, define a first pair of elongate conductive elements consisting of: 1) a first elongate conductive element E1 for transmitting a first analog signal between: the detector electrode end 30A of electrode wire 30, which is embedded within first elongate electrode module 18; and the wireless transmitter unit 16; and 2) a second elongate conductive element E2 for transmitting a second analog signal between: the reference electrode end 32A of electrode wire 32, which is embedded within the first elongate electrode module 20; and the wireless transmitter unit 16. The second retrofit embodiment also defines: a second pair of elongate conductive elements consisting of: 1) a third elongate conductive element E3 for transmitting a third analog signal between: the reference electrode end 32A of electrode wire 32, which is embedded within the second elongate electrode module 20; and the wireless transmitter unit 16; and 2) a fourth elongate conductive element E4 for transmitting a fourth analog signal between: the electrode wire end 30A of electrode wire 30, which is embedded within the second elongate electrode module 18; and the wireless transmitter unit 16.

Figure 10:
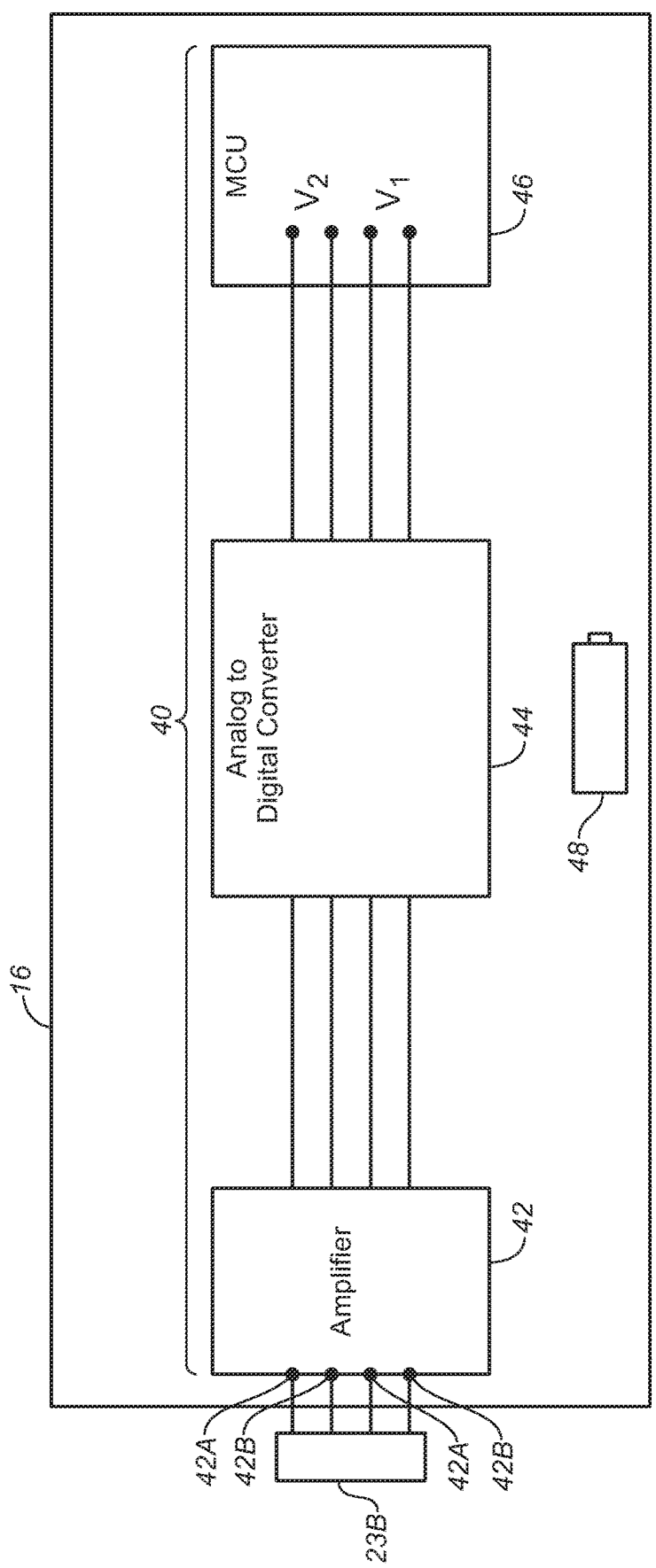
FIG. 10 is a schematic diagram illustrating a wireless transmitter unit of the voltage detection assembly of the second retrofit embodiment of the stray voltage detection system.

The second retrofit embodiment of the stray detection system also differs from the first retrofit embodiment in that the wireless transmitter unit 16, disposed within transmission conduit segment 12, has modified electrical connectors in order to receive and process four analog signals, rather than only two analog signals in connection with the first retrofit embodiment as described above in connection with FIG. 2. Specifically, in the second retrofit embodiment the wireless transmitter unit 16 contains a wireless transmitter circuit 40, as illustrated in FIG. 10, for receiving the first, second, third and fourth analog signals transmitted by first, second, third and fourth elongate conductive elements E1, E2, E3 and E4, respectively. In this regard, the wireless transmitter circuit 40 comprises: 1) two pairs of terminals, 42A and 42B, in electrical connection with a female electrical connector 23B, which is releasably connected to the male electrical connector 23A integral with the "T" junction 24 embedded within junction module 10, thereby completing the connection of the first, second, third and fourth elongate conductive elements, E1, E2, E3 and E4, to the wireless transmitter unit 16; 2) an analog-to-digital converter 44 in electrical connection with the amplifier 42, with the analog-to-digital converter 44 for converting the amplified analog signals to first, second, third and fourth digital signals; and 3) a microcontroller unit 46 in electrical connection with the analog-to digital converter 44. The microcontroller unit 46 is enabled for: 1) converting the first and second digital signals to a voltage value signal V1, which represents the voltage between: the detector electrode end 30A of elongate wire 30, which is embedded within the first elongate electrode module 18, and the reference electrode end of elongate wire 32, which is embedded within the first elongate electrode module 20; and 2) for converting the third and fourth digital signals to a voltage value signal V2 between the reference electrode end 32A of elongate wire 32, which is disposed within the second elongate electrode module 20, and the detector electrode end 30A of elongate wire 30, which is disposed within the second elongate electrode module 18. The microcontroller unit 46 is also for wirelessly sending the voltage value signals V1 and V2 to a retrofitted skimmer lid, which is as described in connection with the retrofit skimmer lid 6 of first retrofit embodiment and illustrated in FIG. 6A, FIG. 6B and FIG. 7. With respect to the processing of the voltage value signals in the second retrofit embodiment, however, the wireless receiver unit 50 within the wireless receiver housing 6B is adapted to receive the voltage value signals V1 and V2, and the microcontroller unit 46 is programmed to compare both voltage value signals V1 and V2 to the threshold value and determine for each voltage value signal if it represents a dangerous stray voltage in the pool water of Pool 2. And, if a dangerous condition is detected, to use the alerting unit 54, which controls the sound and light generating devices, 54A and 54B, respectively, to generate sound and light alerts. As in the first retrofit embodiment, all electrical components integral with the retrofit skimmer lid 6 are powered by a battery 56 disposed within the wireless receiver housing 6B. In this regard, the second retrofit embodiment has the same advantages as the first retrofit embodiment in that for the second light fixture 5 within Pool 2 only a single voltage needs to be measured between a single pair of elongate electrode modules in order to provide a high probability that a dangerous stray voltage is detected in the pool water of Pool 2.

Figure 11:
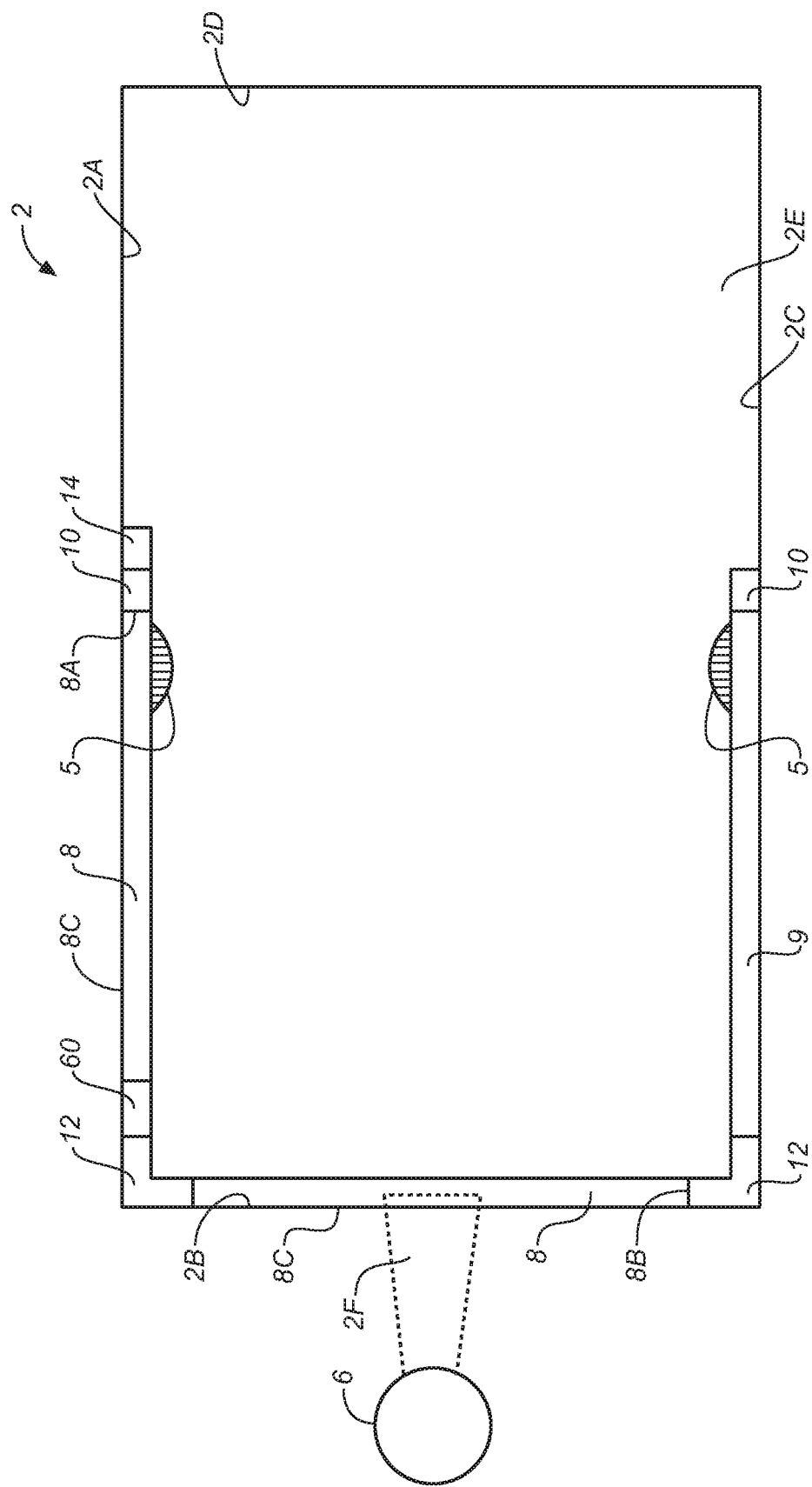
FIG. 11 is a plan view illustration of the addition of a voltage transmission module to the voltage detection assembly of the second retrofit embodiment of the stray voltage detection system.
Figure 13:
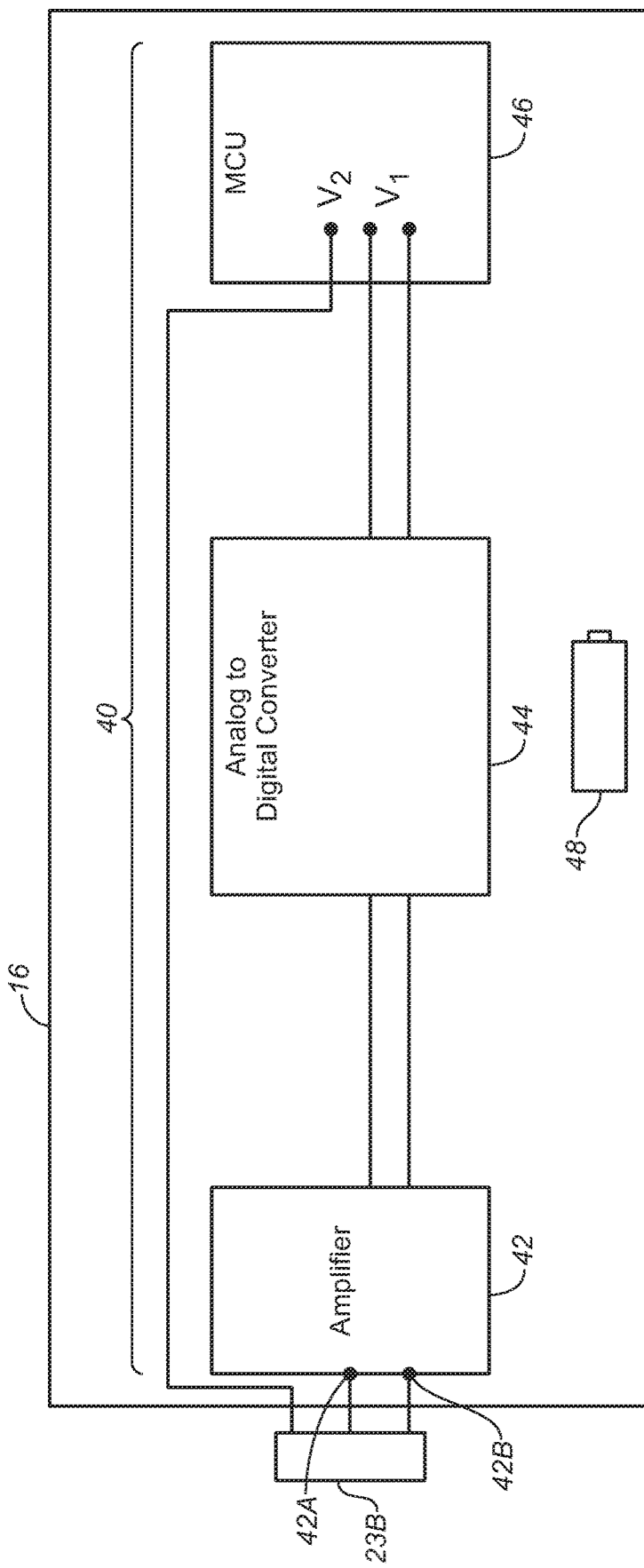
FIG. 13 is a schematic diagram illustrating a wireless transmitter unit of the voltage detection assembly of second embodiment of the stray voltage detection system, with the addition of the voltage transmission module.

An alternate embodiment to the second retrofit embodiment is illustrated in FIG. 11 through FIG. 13. In this embodiment, a voltage transmitter module 60 is releasably connected to the second angled junction module 12 and to the first segment of elongate module 8, with the connections provided in the same manner as described above for the first and second retrofit embodiments. The voltage transmission module 60, as illustrated in FIG. 11, contains the same component parts as disclosed for the wireless transmission module 14 illustrated in FIG. 3, but the wireless transmission circuit 40 determines a voltage value signal V2 from the voltage detected between: detector electrode end 30A of electrode wire 30, which is embedded within the second elongate electrode module 18; and the reference electrode end 32A of the electrode wire 32, which is embedded within the second elongate electrode module 20, and transmits a corresponding voltage value signal V2 to the wireless transmitter 16 as shown in FIG. 12 and FIG. 13. This feature has the advantage of reducing the number of voltage detection connections that need to be connected to the wireless transmission module 14, which in this instance converts end portions of the third and fourth elongate conductive elements, E3 and E4, to a single elongate conductive element E5 that transmits a voltage V2 to the wireless transmitter 16.

In addition to the second retrofit embodiment of the stray voltage detection system for a Pool 2 having two light fixtures 5 integral with the pool walls of the Pool 2, the stray voltage detection system also generally comprises voltage detection assemblies 4 for more than two light fixtures 5. In this regard, it will be apparent to persons skilled in the art that the same type of modifications to the first retrofit embodiment, which have been disclosed in FIG. 8A through FIG. 10 describing the second retrofit embodiment, would readily describe additional retrofit embodiments with more than two light fixtures 5 integral with the pool walls of the Pool 2. And, regardless of the number of light fixtures 5 integral with Pool 2, the placement of elongate electrode module 18 adjacent to a light fixture 5 and the placement of a corresponding elongate electrode module 20 adjacent to a corner of the Pool 2 formed by adjacent pool walls, with a maximum linear distance separating the detector electrode end 30A and reference electrode end 32A, unexpectedly provides the greatest probability of detecting a dangerous stray voltage in the Pool 2 originating from the light fixture 5. Another related but unexpected advantage relates to the ease of installing the stray voltage detection system in a Pool 2 having a plurality of light fixtures 5 in a manner that ensures the maximum probability of detecting a stray voltage. For example, if the Pool 2 has a great many light fixtures, all the installer needs to do, with respect to each light fixture 5, is to secure the voltage detection assembly 4 to the Pool 2 such that an elongate electrode module 18 is adjacent to a light fixture 5, with the detector electrode end 30A adjacent to and as close as practicable to the light fixture 5, and that a corresponding elongate electrode module 20 is adjacent to a corner of the Pool 2 and a maximum distance from the elongate electrode 18. Even if the light fixture 5 is not integral with a pool wall of the Pool 2 but is integral the bottom of the Pool 2, the installation procedure is the same, with the elongate electrode module 18 adjacent to the light fixture 5 and with the corresponding elongate electrode module 20 placed in a corner of the pool that is as far away as practicable from the elongate electrode 18.

Figure 14:
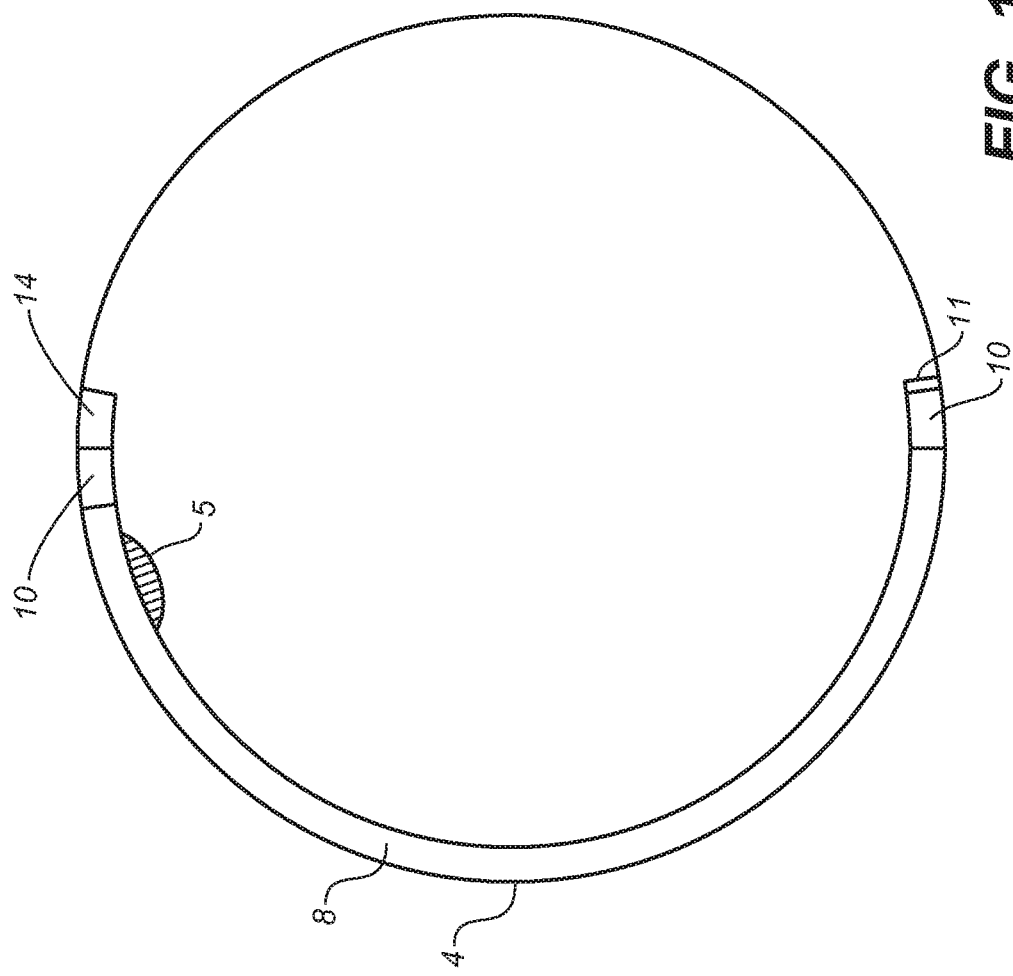
FIG. 14 is a plan view illustration of a voltage detection assembly for a circularly shaped pool.

The description of the first retrofit embodiment for the Pool 2 having a rectangular shape also can be adapted to Pools 2 having other generally polygonal shapes with intersecting pool walls. Similarly, the first retrofit embodiment can be adapted to Pools 2 having pool walls that are continuous, like circularly and elliptically shaped Pools 2. As an example of a Pool 2 having a continuous pool wall, FIG. 14 illustrates a third retrofit embodiment of the stray voltage detection system for a Pool 2 having a circular shape and with a light fixture 5 integral with the pool wall of the Pool 2. A voltage detection assembly 4 of the third retrofit embodiment has many of the same component parts and corresponding numerical identifications as the voltage detection assembly 4 of the first retrofit embodiment, with the differences related the fact that the Pool 2 has a circular shape rather than a rectangular one. The Pool 2 having a circular shape is retrofitted by curving the voltage detection assembly 8 around the inside perimeter of the top portion of the wall of the Pool 2. A first junction module 10 and transmission module 14 have the same structures as the corresponding modules disclosed in the first retrofit embodiment, with the first junction module 10 connected to an end of elongate module 8 in the same manner as disclosed in connection with the first retrofit embodiment, and with transmission module 14 connected to the junction module 10 also in the same manner as disclosed in connection with the first retrofit embodiment. The third retrofit embodiment, however, discloses that a second junction module 10 is releasably connected to the other end of the elongate module 8, rather than connecting a first angled junction module 12 as in the first retrofit embodiment. An elongate electrode module 18 is releasably connected and wired to the first junction module 10 in the same manner that the first elongate electrode module 18 is releasably connected and wired to the first junction module 10 in the first retrofit embodiment. And, an elongate electrode module 20 is releasably connected and wired to the second junction module 10 in the same manner that the first elongate electrode module 20 is releasably connected and wired to first angled junction module 12 in the first retrofit embodiment.

In the third retrofit embodiment, the elongate electrode module 18 and the elongate electrode module 20 are positioned on diametrically opposite and facing sides of the Pool 2 having a circular shape, with the detector electrode end 30A of elongate electrode module 18 adjacent to and as close as practicable to light fixture 5. In this regard, the diametrical separation of the elongate electrode modules, 18 and 20, ensures that the modules are spaced apart as far practicable. This spacing also ensures that any stray voltage in the pool water of Pool 2 having a circular shape that is detected between the detector and reference electrode ends, 30A and 32A, emanating from the light fixture 5, will be the highest voltage as compared to other voltages that might be detected at other locations in the pool water and, thus, provides the highest probability that a stay voltage will be detected, as compared to the lower probability that a stray voltage will be detected if the detector and reference electrode ends, 30A and 32A, are separated by a lesser distance.

Figure 15:
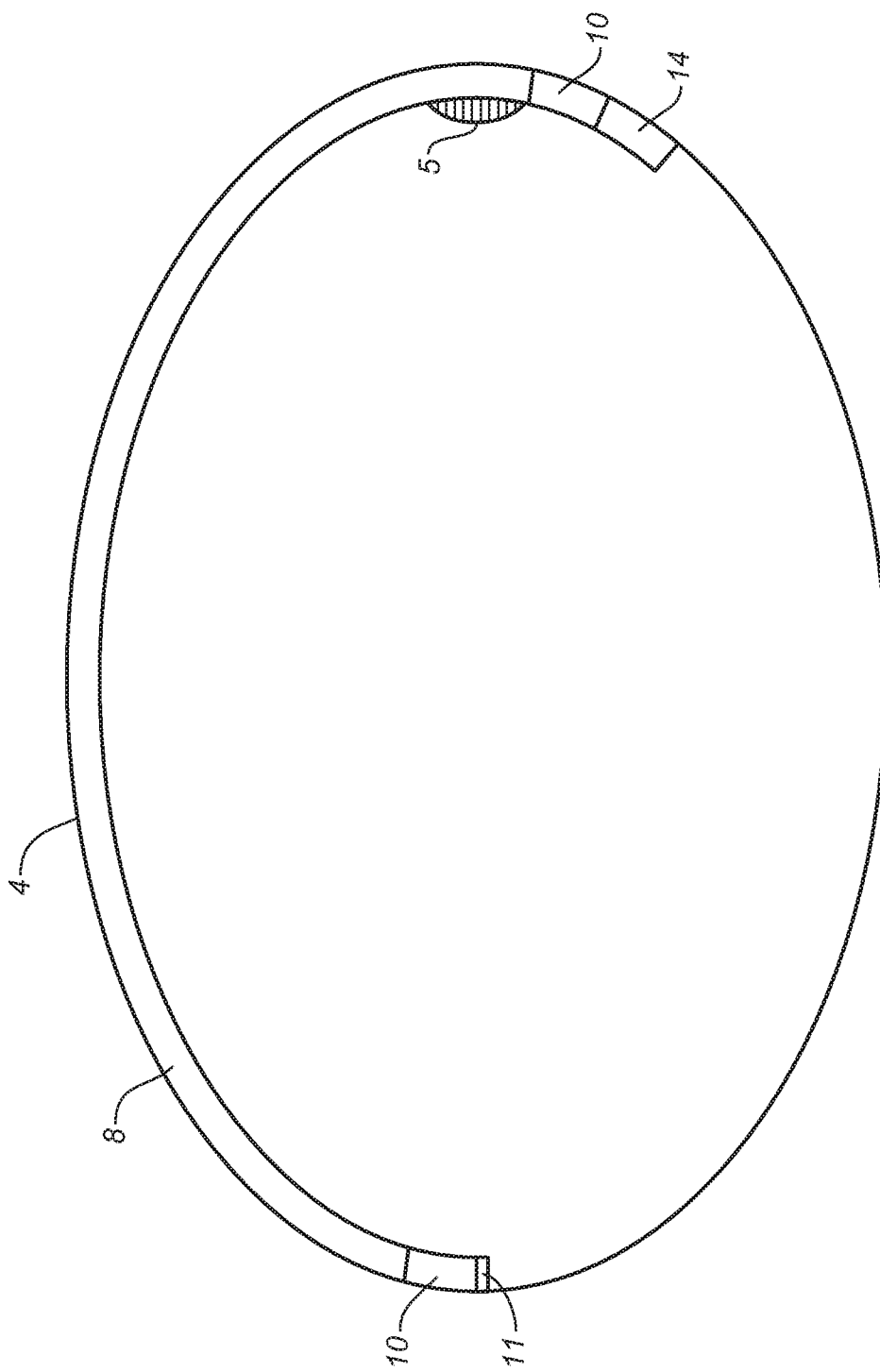
FIG. 15 is a plan view illustration of a voltage detection assembly for an elliptically shaped pool.

Similarly, in another example, FIG. 15 illustrates a fourth retrofit embodiment of the stray voltage detection system for a Pool 2 having an elliptical shape and with a light fixture 5 integral with the side of the Pool 2 and positioned at a vertex of the elliptical shape. In this regard, the fourth retrofit embodiment is nearly identical to the third retrofit embodiment, with the only difference being that a detector electrode end 30A of an elongate electrode module 18 is positioned adjacent to and as close as practicable to the light fixture 5 at an apex of the Pool 2, and an elongate electrode module 20 of second junction module 10 is positioned as far away as practicable at an opposite and facing apex of the Pool 2. As in the third retrofit embodiment, this spacing ensures that any stray voltage in the pool water of Pool 2 that is detected between the detector and reference electrode ends, 30A and 32A, emanating from the light fixture 5, will be the highest voltage as compared to other voltages that might be detected at other locations in the pool water and, thus, provides the highest probability that a stay voltage will be detected, as compared to the lower probability that a stray voltage will be detected if the detector and reference electrode ends, 30A and 32A, are separated by a lesser distance.

In addition to the stray voltage detection system for retrofitting the Pool 2 having a rectangular shape, the stray voltage detection system also comprises a stray voltage detection system incorporated into a newly constructed Pool 2 having rectangular shape and a single electric light fixture 5 (hereinafter referred to as the "first new construction embodiment").

Figure 16:
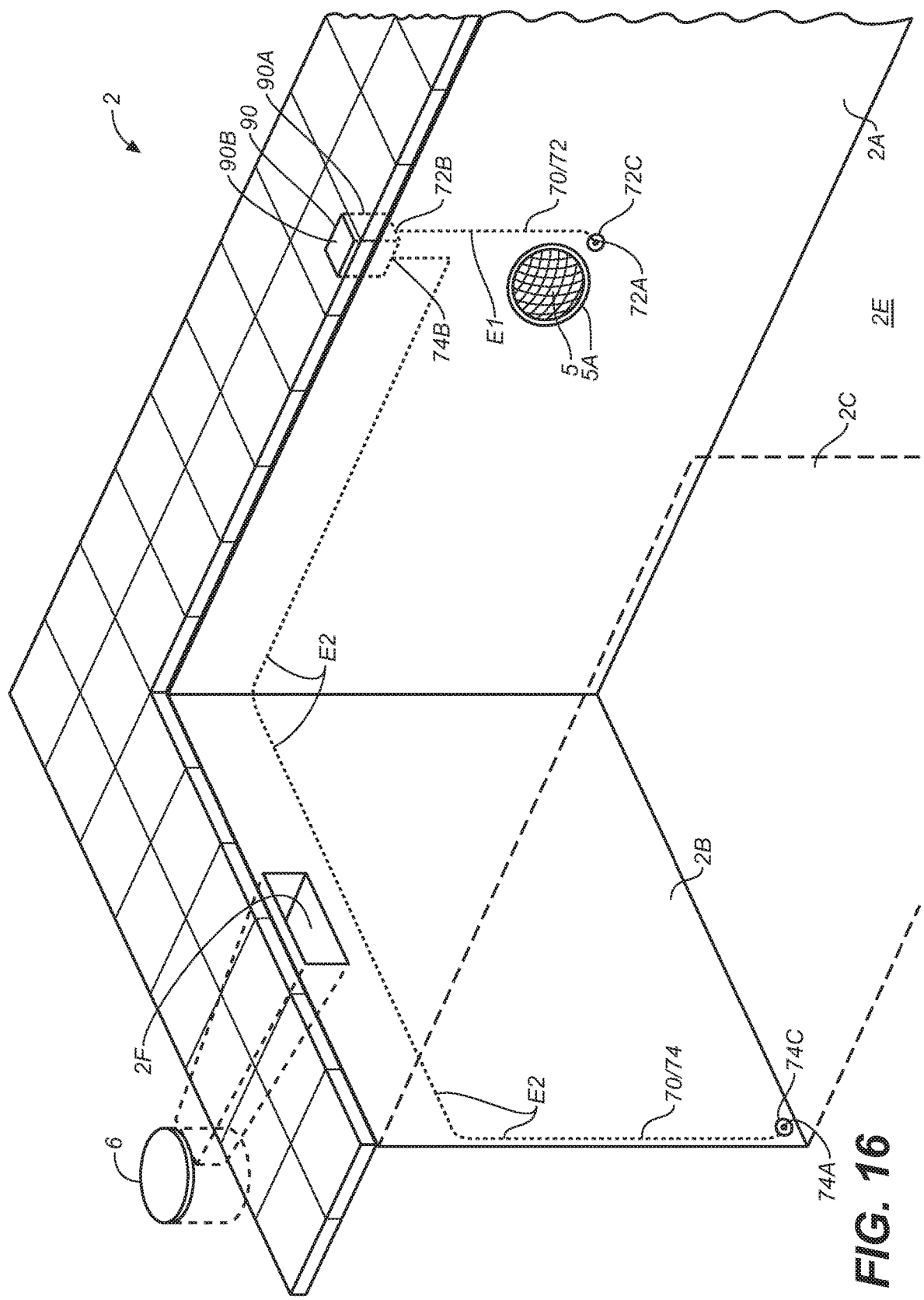
FIG. 16 is a perspective view illustration of a first new construction embodiment of a stray voltage detection system for a rectangularly shaped pool having an electrical fixture integral with a pool wall.

The first new construction embodiment has the same novel features as the first retrofit embodiment for a Pool 2, but rather than attaching the voltage detection assembly 4 to the inside surface of the pool walls of the Pool 2, a voltage detection assembly 70, as illustrated in FIG. 16, is integrally embedded within the pool walls 2A and 2B and within the intersection of pool walls 2B and 2C of the Pool 2, with the figure illustrating portions of the voltage detection assembly 70 in dashed lines. The voltage detection assembly 70 comprises a wire 72, which is insulated and electrically conductive, with the wire 72 disposed within a pool wall 2A of Pool 2, and with the wire 72 preferably also disposed within an elongate conduit that is embedded in the pool wall. The wire 72 has a wire end that is not insulated and is disposed within an opening 72C through the pool wall 2A; thereby forming a detector electrode end 72A that is in contact with the environment outside of the pool wall 2A, and specifically, in contact with the pool water when the Pool 2 contains water. The wire 72 has an opposite wire end that forms a connecting end 72B for connecting the wire 72 to a wireless transmitter 90, which is also part of the voltage detection assembly 70. In this regard, the wire 72 and its detector electrode end 72A and connecting end 72B form a first elongate conductive element E1 out of a first pair of elongate conductive elements for transmitting a first analog signal to the wireless transmitter 90. The voltage detection assembly 70 also comprises a wire 74, which is insulated and electrically conductive, with the wire 74 disposed within a pool walls 2A and 2B and within the intersection of pool walls 2B and 2C of Pool 2, and with the wire 74 preferably also disposed within an elongate conduit that is embedded in the pool walls. The wire 74 has a wire end that is not insulated and is disposed within an opening 74C through the intersection of pool walls 2B and 2C; thereby forming a reference electrode end 74A that is in contact with the environment outside of the intersection of pool walls 2B and 2C, and specifically, in contact with the pool water when the Pool 2 contains water. The wire 74 has an opposite wire end that forms a connecting end 74B for connecting the wire 74 to the wireless transmitter 90. And, the wire 74 and its reference electrode end 74A and connecting end 74B form a second elongate conductive element E2 out of the first pair of elongate conductive elements for transmitting a second analog signal to the wireless transmitter 90.

The detector electrode end 72A of wire 72 is preferably positioned adjacent to and as close as practicable to the electric light fixture 5A, and the reference electrode end 74A of the wire 74, is preferably positioned at the intersection of pool walls 2B and 2C and adjacent to the pool bottom 2E. As in the first retrofit embodiment, the positions of the detector electrode end 72A and reference electrode 74A ensures that any stray voltage in the pool water of Pool 2 that is detected between the detector and reference electrodes, 72A and 74A, emanating from the light fixture 5, will be the highest voltage as compared to voltages that might be detected at other locations in the pool water and, thus, provides the highest probability that a stay voltage will be detected, as compared to the lower probability that a stray voltage will be detected if the detector and reference electrodes, 72A and 74A, are separated by a lesser distance.

Figure 17:
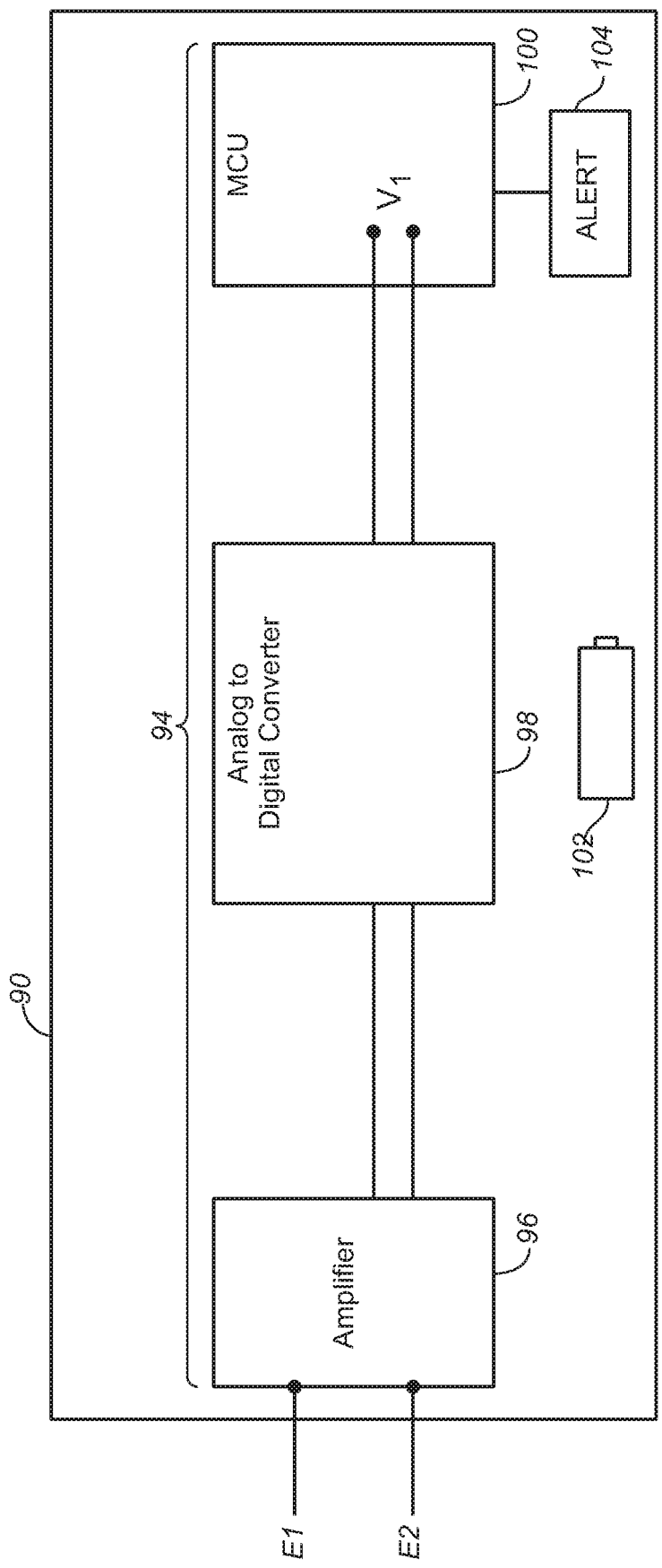
FIG. 17 is a schematic diagram illustrating a wireless transmitter unit of a voltage detection assembly of the first new construction embodiment of the stray voltage detection system.
Figure 18:
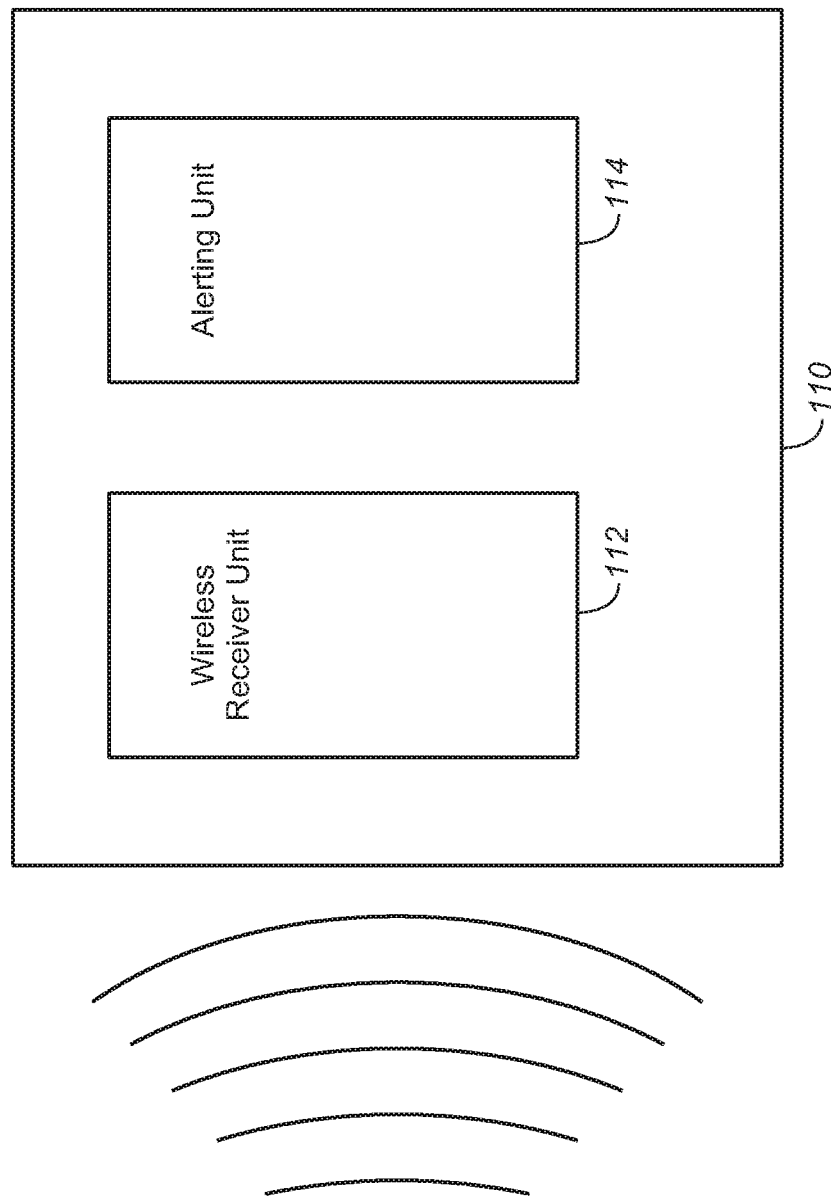
FIG. 18 is a schematic diagram illustrating a wireless receiver unit of the first and second new construction embodiments of the stray voltage detection system.

As shown in FIG. 16, a bottom portion 90A of the wireless transmitter 90 of the first new construction embodiment is integrally embedded within pool wall 2A of Pool 2. A top portion 90B of the wireless transmitter 90, however, is not embedded in the pool wall 2A, but is in preferably flush with a top surface of the Pool 2. And as illustrated in FIG. 17, the wireless transmitter 90 comprises a wireless transmission circuit 94, which comprises an amplifier 96, analog-to-digital converter 98, microcontroller unit 100, a battery 102 and alert unit 104. The figure also shows that the first elongate conductive elements E1 and E2, are in electrical connection with the wireless transmission circuit 94, with the connections for transmitting first and second analog signals from detector electrode end 72A and reference electrode end 72B to the wireless transmitter 90. The first and second analog signals are processed just like the signals are processed by the wireless transmitter 16 as in the first retrofit embodiment in order to produce a voltage value signal V1, representing the voltage between the detector electrode end 72A and reference electrode end 72B. In the first new construction embodiment, however, the microcontroller unit 100 is programmed to compare the voltage value signal V1 to a predetermined threshold voltage value, and generate an alert signal if the voltage value V1 exceeds the predetermined threshold voltage value, indicating that a dangerous stray voltage exists in the pool water of Pool 2. The alert signal is sent to alert unit 104 in connection with the wireless transmission circuit 94, with the alert unit 104 preferably illuminating a light and generating a sound warning persons in the Pool 2 or intending to enter the Pool 2 that a dangers stray voltage exists in the pool water. The wireless transmitter 90 can also wirelessly send the alert signal to a wireless receiver 110, illustrated in FIG. 18, which is positioned away from the Pool 2, for example in a house adjacent to the Pool 2, and preferably with the wireless receiver unit 110 receiving electrical power by plugging the unit into an electrical outlet integral with the electrical wiring of the house. The wireless receiver 110 comprises a wireless receiver unit 112 for receiving the alert signal and an alerting unit 114 for preferably illuminating a light and generating a sound warning persons intending to enter the Pool 2 that a dangerous stray voltage exists in the pool water.

Figure 19:
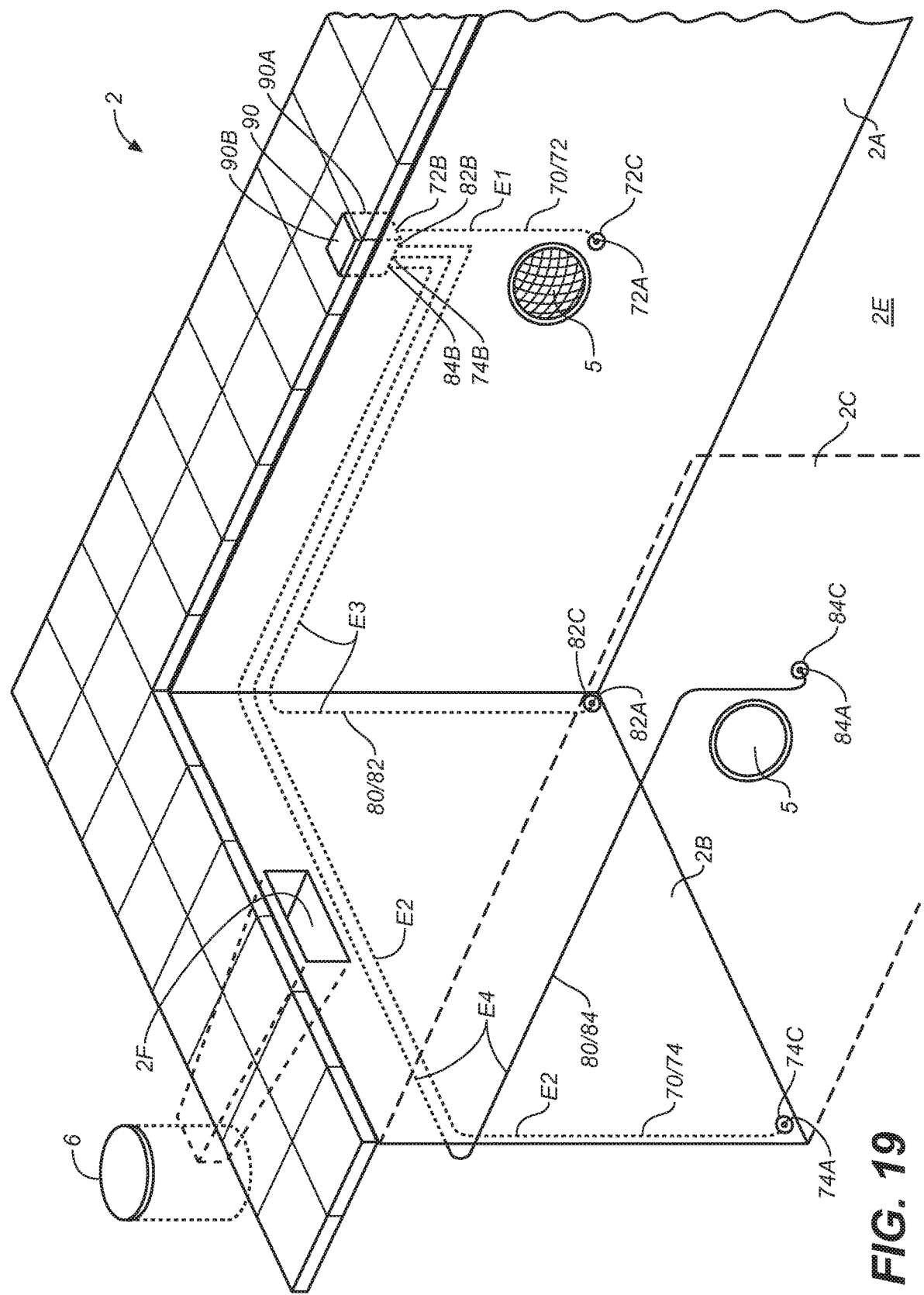
FIG. 19 is a perspective view illustration of a second new construction embodiment of a stray voltage detection system for a rectangularly shaped pool having a pair of electrical fixtures integral with opposite pool walls.

A second new construction embodiment, which pertains to a Pool 2 with two electric light fixtures, comprises the voltage detection assembly 70 and also comprises a voltage detection assembly 80. As illustrated in FIG. 19, the voltage detection assembly 80 comprises a wire 82, which is insulated and electrically conductive, with the wire 82 disposed within pool wall 2A of Pool 2 and the intersection of pool walls 2A and 2B of Pool 2, and with the wire 82 preferably also disposed within an elongate conduit that is embedded in the pool wall. The wire 82 has a wire end that is disposed within an opening 82C through the intersection of pool walls 2A and 2B; thereby forming a reference electrode end 82A that is in contact with the environment outside of the pool wall 2A, and specifically, in contact with the pool water when the Pool 2 contains water. The wire 82 has an opposite wire end that forms a connecting end 82B for connecting the first wire 82 to the wireless transmitter 90, which is also part of the voltage detection assembly 80. In this regard, the wire 82 and its reference electrode end 82A and connecting end 82B form a third elongate conductive element E3 out of a second pair of elongate conductive elements for transmitting a third analog signal to the wireless transceiver 90. The voltage detection assembly 80 also comprises a wire 84, which is insulated and electrically conductive, with the wire 84 disposed within pool walls 2A, 2B and 2C of Pool 2 and with the wire 84 preferably also disposed within an elongate conduit that is embedded in the pool wall. The wire 84 has a wire end that is disposed within an opening 84C through the pool wall 2C; thereby forming a detector electrode end 84A that is in contact with the environment outside of the intersection of pool wall 2C, and specifically, in contact with the pool water when the Pool 2 contains water. The wire 84 has an opposite wire end that forms a connecting end 84B for connecting the wire 84 to the wireless transmitter 90. And, the wire 84 and its detector electrode end 84A and connecting end 84B form a fourth elongate conductive element E4 out of the second pair of elongate conductive elements for transmitting a fourth analog signal to the wireless transmitter 90. In this regard, the third and fourth analog signals are processed by the wireless transmitter 90 just like the first and second analog signals are processed as described above, with a voltage value signal V2 sent to the alert unit 104 and to the wireless receiver 110, where an alert is generated in the form of a light and or sound.

The detector electrode end 84A of wire 84, is preferably positioned adjacent to and as close as practicable to the electric light fixture 5, and the reference electrode end 82A of wire 82, is preferably positioned at the intersection of pool walls 2A and 2B and adjacent to the pool bottom 2E. As in the first retrofit embodiment, the positions of the detector electrode end 84A and reference electrode 82A ensures that any stray voltage in the pool water of Pool 2, emanating from the light fixture 5, that is detected between the detector and reference electrodes, 84A and 82A, emanating from the light fixture 5, will be the highest voltage as compared to voltages that might be detected at other locations in the pool water and, thus, provides the highest probability that a stay voltage will be detected, as compared to the lower probability that a stray voltage will be detected if the detector and reference electrodes, 84A and 82A, are separated by a lesser distance.

Further, it will be readily apparent to a person skilled in the art, that the description of the first and second new construction embodiments described for one or two light fixtures 5 integral the walls of pool walls of Pool 2 having a rectangular shape also applies to Pools 2 having generally polygonal shapes with intersecting pool walls. Similarly, the description of the first and second new construction embodiments applies to Pools having continuous walls, like circularly and elliptically shaped Pools 2.

The retrofit and new construction embodiments described above provide stray voltage detection systems that are exceptionally efficient and exhibit the highest probability for detecting a stray voltage in pool water arising from an electrical fixture integral with a pool wall. These systems are both efficient and successful due to the novel features of using only a single pair of elongate electrode elements to detect the stray voltage, with a detector electrode end of one of the elongate electrode elements positioned adjacent to and as close as practicable the electrical fixture, and with a reference electrode end the other elongate electrode element positioned on a pool wall that is opposite from and facing the pool wall containing the first elongate electrode element. And, the probability of detecting a stray voltage is even higher if the detector and reference electrodes are positioned as far apart as practicable given the constraint of the pool walls. These stray voltage detection systems, however, are not appropriate when the stray voltage arises from "ground current" flowing through the pool water, with the ground current coming from a source unrelated to an electrical fixture integral with the pool wall. Ground current can arise due to various environmental conditions, most notably from faulty electrical wiring in buildings or other structures that are not part of the Pool. As a result, it is not possible to anticipate where the ground current might enter the pool water. Accordingly, in a preferred embodiment for detecting stray voltage from ground current, it is necessary to utilize a different configuration for the elongate electrode elements.

Figure 20:
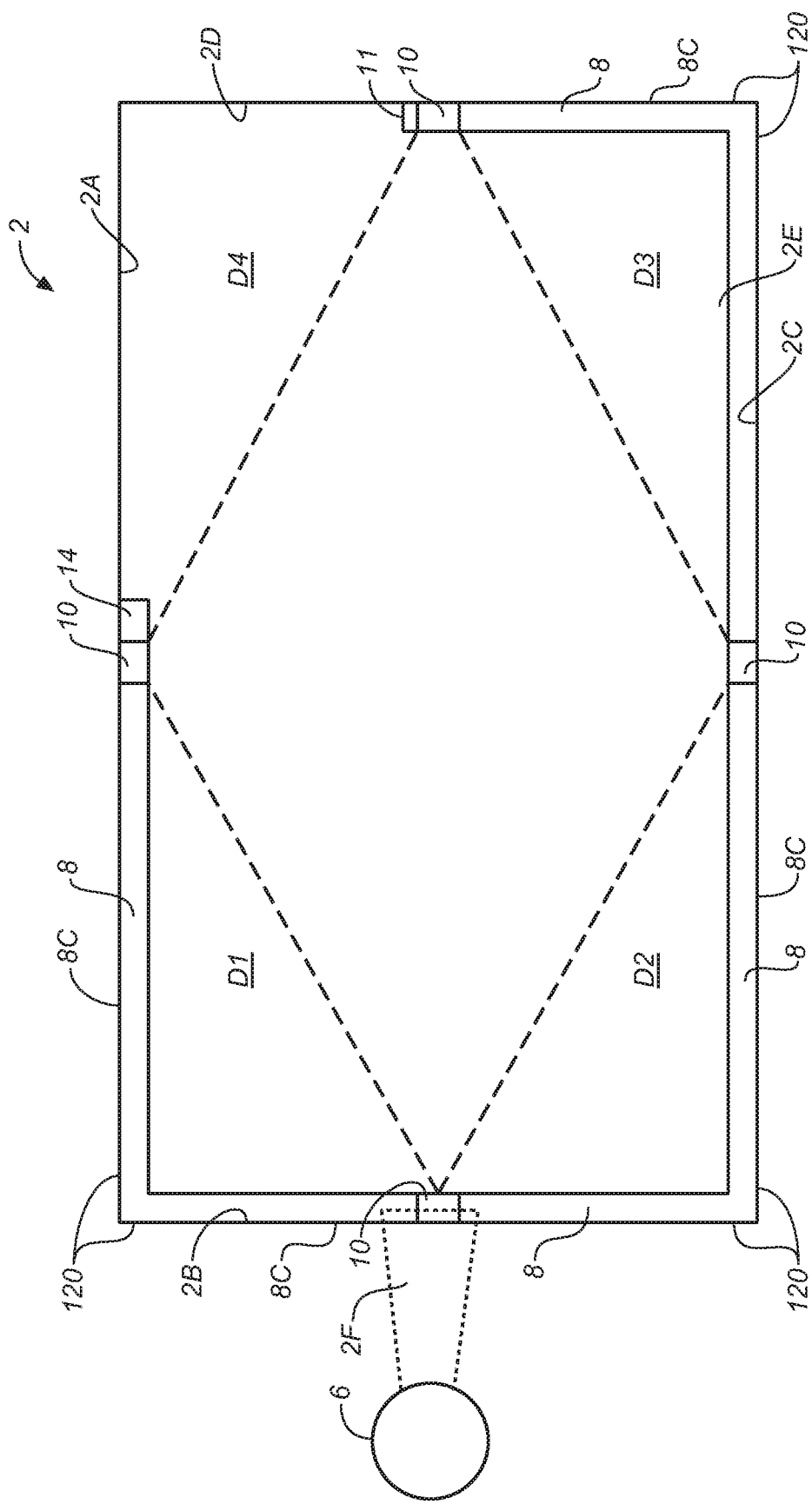
FIG. 20 is a plan view illustration of a retrofit embodiment of a stray voltage detection system for detecting stray voltage within a rectangularly shaped pool coming from ground current.

FIG. 20 illustrates a stay voltage detection system for retrofitting the Pool 2 having a rectangular shape in order to detect a stray voltage in the Pool 2 caused by ground current (hereinafter referred to as the "retrofit ground current embodiment"). In this regard, the retrofit ground current embodiment, as illustrated in FIG. 20, utilizes many of the same component parts and corresponding identification numbers as disclosed in connection with the first and second retrofit embodiments.

The retrofit ground current embodiment comprises a voltage detection assembly 120, which comprises: first, second, and third elongate modules 8; a first pair of junction modules 10 and a second pair of junction modules 10; a transmission module 14 encasing a wireless transmitter unit 16; and a first pair of elongate electrode modules, 18 and 20, and a second pair of elongate electrode modules, 18 and 20. Each of these modules has the same general structure as the modules disclosed in connection with the voltage detection assembly 4 of first and second retrofit embodiments, but the number and placement of the modules of the voltage detection assembly 120 is different than the modules of the voltage detection assembly 4. More specifically, as illustrated in FIG. 20, the first pair of junction modules 10 are for releasable attachment to opposite sides of the Pool 2, with one of the junction modules 10 positioned on pool wall 2A and the other junction module 10 positioned on pool wall 2C. Similarly, the second pair of junction modules 10 are for attachment to opposite sides of the pool, with one of the junction modules 10 positioned on pool wall 2B and the other junction module positioned on pool wall 2D. In addition, each of the junction modules 10 out of the first and second pairs of junction modules 10 is positioned such that each junction module 10 is equidistant from an adjacent junction module 10, with the distances shown as dashed lines, D1, D2, D3 and D4, in the figure. And, the first, second, and third elongate modules 8 are also for releasable connection to corresponding junction modules 10. FIG. 20 also illustrates that each of the junction modules 10 and elongate modules 8 of voltage detection assembly 120 are further positioned around the perimeter of the Pool 2, in a manner similar to the voltage detection assembly 4.

The elongate electrode modules, 18 and 20, out of the first pair of elongate electrode modules of the voltage detection assembly 120, are for releasable connection to corresponding junction modules 10 out of the first pair of junction modules 10, with the manner of connection the same as disclosed with respect to the voltage detection assembly 4. Similarly, the elongate electrode modules, 18 and 20, out of the second pair of elongate junction modules of the voltage detection assembly 120, are for releasable connection to corresponding junction modules 10 out of the second pair of junction modules 10, with the manner of connection the same as disclosed in connection with the voltage detection assembly 4. Elongate electrode modules, 18 and 20, out of the first pair of elongate modules are for releasable connection in a vertical position to pool walls 2A and 2C, respectively, with a bottom end of elongate electrode module positioned a predetermined distance above bottom end 2E of the Pool 2. In like fashion, elongate electrode modules, 18 and 20, out of the second pair of elongate modules are for releasable connection in a generally position to pool walls 2B and 2D, respectively, with a bottom end of elongate electrode module positioned a predetermined distance above bottom end 2E of the Pool 2. This placement of the first and second pairs of elongate electrode modules ensures that each elongate electrode module is equidistant from an adjacent elongate electrode module.

The transmission module 14, as shown in FIG. 20, is for releasable connection to a junction module 10 out of the first pair of junction modules that is releasably connected to pool wall 2A. Again, this connection is provided in the same manner as the connection described with respect to the voltage detection assembly 4.

Figure 21:
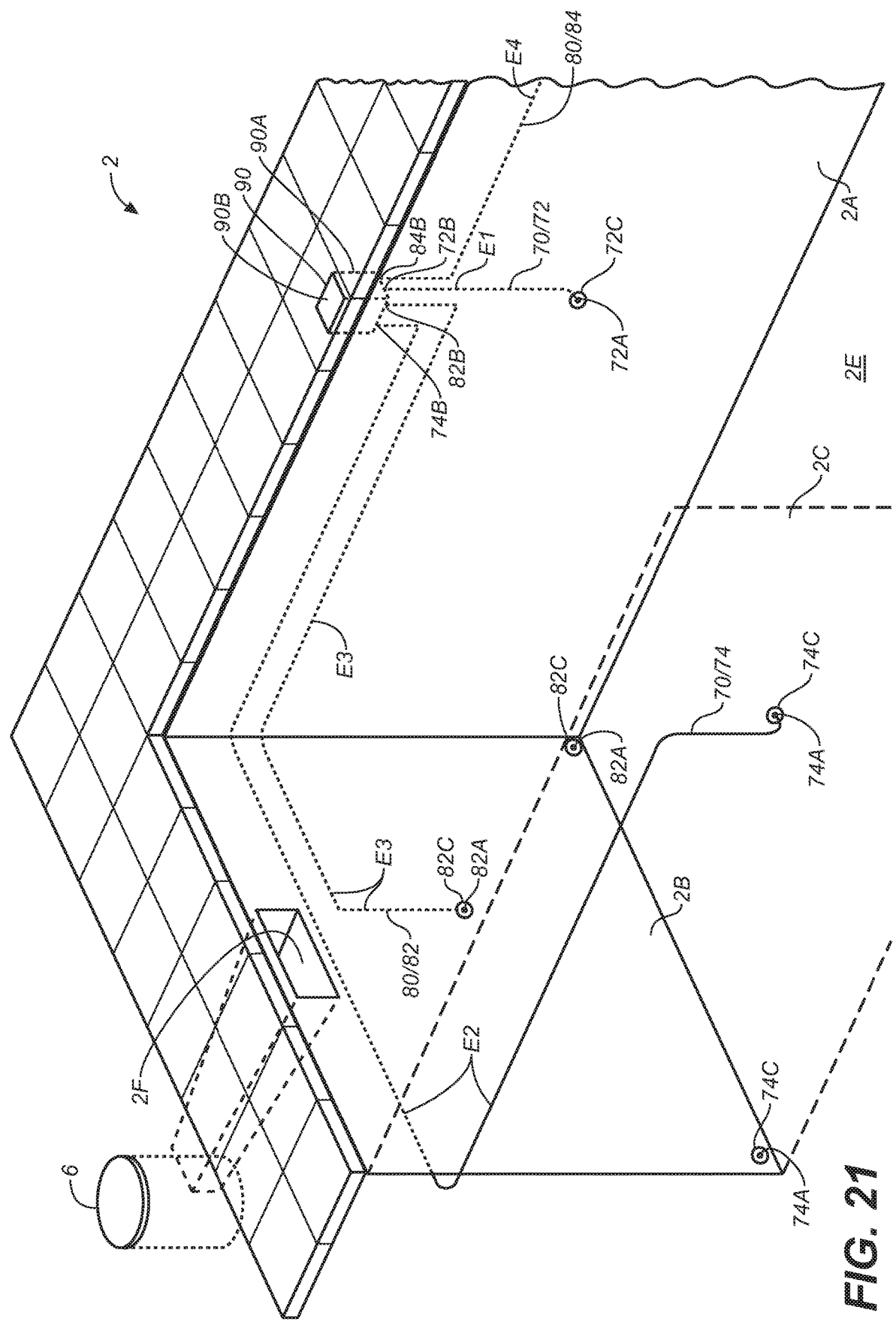
FIG. 21 is a perspective view illustration of a new construction embodiment of a stray voltage detection system for a rectangularly shaped pool coming from ground current.

Wire segments, which are insulated and electrically conductive, are embedded in corresponding modules as follows: the first and second pairs of elongate electrode modules 18 and 20; the first and second pairs of junction modules 10; and the first, second and third elongate modules 8. As illustrated in FIG. 21, these wire segments are releasably connected, in the manner described with respect to the voltage detection assembly 4, so as to form continuous electrical connections, referred to herein as elongate conductive elements E1, E2, E3, and E4, with each elongate conductive element having a detector electrode end for detecting a voltage in the pool water and a connecting end for connecting the elongate conductive element to the wireless transmitter 16 encased within the wireless transmission module 14. Accordingly, elongate conductive element E1 connects a detector electrode end of a wire segment embedded within the elongate electrode module 18 out of the first pair of elongate electrode modules to the wireless transmitter 16; and elongate conductive element E2 connects a reference electrode end of a wire segment embedded within the elongate electrode module 20 out of the first pair of elongate electrode modules to the wireless transmitter 16. Similarly, elongate conductive element E3 connects a detector electrode end of a wire segment embedded within the elongate electrode module 18 out of the second pair of elongate electrode modules to the wireless transmitter 16; and elongate conductive element E4 connects a reference electrode end of a wire segment embedded within the elongate electrode module 20 out of the second pair of elongate electrode modules to the wireless transmitter 16. In this regard, the detector electrode ends extend through openings within bottom portions of corresponding elongate electrode modules 18, and the reference electrode ends extend through openings within bottom portions of corresponding elongate electrode modules 20. As a result, the detector electrode ends and reference electrode ends are in contact with the environment outside of the elongate electrode modules 18 and 20 and, specifically, in contact with pool water when the Pool 2 contains water. In this regard, it is preferable that the detector and electrode ends are positioned around a perimeter of the inside surface of the pool walls 2A, 2B, 2C, and 2D of Pool 2, such that each detector electrode end is equidistant from adjacent reference electrode ends, and similarly that each reference electrode end is equidistant from adjacent detector electrode ends. And, it also preferable that each of the detector and reference electrode ends are positioned equidistant between the bottom 2E of the Pool 2 and the recommended level of the pool water or the water level that is customarily maintained by the user. Again, with respect to the description of a detector electrode end and reference electrode end, the differential nomenclature is only for convenience and clarity. Both electrode ends perform the same physical function of detecting a voltage between the electrodes.

The elongate conductive elements E1, E2, E3, and E4 transmit analog signals from the detector and reference electrode ends to the wireless transmitter 16 in the same manner as described above in connection with the second retrofit embodiment, with the microcontroller unit 46 within the wireless transmitter 16 for generating voltage value signals V1 and V2. Voltage value signal V1 represents the voltage between the detector electrode end and the reference electrode end of the first pair of elongate detector electrodes 18 and 20; and voltage value signal V2 represents the voltage between the detector electrode end and the reference electrode end of the second pair of elongate detector electrodes 18 and 20. These voltage value signals are wirelessly sent to the wireless receiver unit 50 within the wireless receiver housing 6B integral with the retrofit skimmer lid 6, as illustrated in FIG. 6A, FIG. 6B and FIG. 7. The microcontroller unit 52 in electronic communication with the wireless receiver unit 50 is for determining whether either of the voltage value signals is greater than a predetermined threshold voltage value; and an alerting unit 54 in electronic communication with the microcontroller unit 52 is for issuing one or more alerts to persons in the pool water or about to enter the pool water if the microcontroller unit 52 has determined that a voltage value signal is, in fact, greater than the threshold voltage value, meaning that a harmful or life threatening stray voltage exists in the pool water of Pool 2. Sound and light generating devices, 54A and 54B, integral with the retrofit skimmer lid 6 and in electronic communication with the alerting unit 54, are for generating sound and light alarms warning persons of the dangerous stray voltage in the pool water.

In addition to the retrofit ground current embodiment, the voltage detection system also includes a new construction ground current embodiment. This embodiment utilizes the same components that are disclosed in connection with the voltage detection assemblies, 70 and 80, of the first and second retrofit new construction embodiments. And, this embodiment incorporates those assemblies into the walls of Pool 2 having a rectangular shape in the same manner as disclosed with respect to the first and second retrofit new construction embodiments. The only difference in the implementation of the new construction ground current embodiment relates to the placement of the first and second pairs of elongate conductive elements E1 and E2 and the second pair of elongate conductive elements E3 and E4. As illustrated in FIG. 21, the detector and reference electrodes ends, 72A and 74A of elongate conductive elements E1 and E2, respectively, are disposed through pool wall openings 72C and 74C respectively. Similarly, the detector and reference electrodes ends, 82A and 84A (not shown) of elongate conductive elements E3 and E4, respectively, are disposed through pool wall openings 82C and 84C (not shown), respectively. In this regard, it is preferable that the detector and electrode ends are positioned around a perimeter of the inside surface of the pool walls 2A, 2B, 2C, and 2D of Pool 2, such that each detector electrode end is equidistant from adjacent reference electrode ends, and similarly that each reference electrode end is equidistant from adjacent detector electrode ends. And, it also preferable that each of the detector and reference electrode ends are positioned equidistant between the bottom 2E of the Pool 2 and the recommended level of the pool water or the water level that is customarily maintained by the user. Other than the different placement of the detector and reference electrode ends, the new construction ground current embodiment is utilized in the same manner as the first and second new construction embodiments in order to detect stray voltage in the pool water of Pool 2.

Although a preferred embodiment and other embodiments have been described for the retrofit and new construction stray voltage detection systems, it will be recognized by those skilled in the art that other embodiments and features can be provided without departing from the underlying principles of those embodiments. The scope of the invention is defined by the appended claims.

The invention claimed is:

1. A retrofit voltage detection system for detecting a stray voltage in pool water contained within a pool caused by a first electrical fixture integral with a pool wall of the pool, with the retrofit voltage detection system comprising:
   a first elongate conductive element out of a first pair of elongate conductive elements, with the first elongate conductive element having a detector electrode end and a connecting end, with the first elongate conductive element for attachment to the pool wall, and with the detector electrode end of the first elongate conductive element adjacent to a first surface of the pool wall, and adjacent to and as close as practicable to the first electrical fixture;
   a second elongate conductive element out of the first pair of elongate conductive elements, with the second elongate conductive element having a reference electrode end and a connecting end, with the second elongate conductive element for attachment to the pool wall, and with the reference electrode end of the second elongate conductive element adjacent to a second surface of the pool wall, which is across from and facing the first surface of the pool wall;
   a wireless transmitter in electrical connection with the connecting ends of corresponding first and second elongate conductive elements, and with the wireless transmitter enabled: to detect a first stray voltage between the detector electrode end of the first elongate conductive element and the reference electrode end of the second elongate conductive element; and to generate and wirelessly transmit a first voltage value signal; and
   a wireless receiver in wireless communication with the wireless transmitter, with the wireless receiver enabled: to receive the first voltage value signal from the wireless transmitter; to compare the first voltage value signal to a predetermined threshold voltage value; and to generate an alert indicating that a dangerous stray voltage has been detected in the pool water if the first voltage value signal exceeds the predetermined threshold voltage value.

2. The retrofit voltage detection system of claim 1 in which the reference electrode end of the second elongate conductive element is positioned so as to maximize the distance between reference electrode end of the second elongate conductive element and the detector electrode end of the first elongate conductive element.

3. The retrofit voltage detection system of claim 1 in which the wireless receiver is integral with a pool skimmer lid.

4. The retrofit voltage detection system of claim 1 in which the wireless receiver is integral with a structure separate from the pool.

5. The retrofit voltage detection system of claim 1 in which the first conductive element is disposed within an elongate module that is not electrically conductive.

6. The retrofit voltage detection system of claim 5 in which the elongate module has an elongate flat side for attaching the elongate module to the pool wall.

7. The retrofit voltage detection system of claim 5 in which the elongate module is disposed within an elongate channel for attachment to the pool wall.

8. The retrofit voltage detection system of claim 1 in which the second conductive element is disposed within an elongate module that is not electrically conductive.

9. The retrofit voltage detection system of claim 8 in which the elongate module has an elongate flat side for attaching the elongate module to the pool wall.

10. The retrofit voltage detection system of claim 8 in which the elongate module is disposed within an elongate channel for attachment to the pool wall.

11. The retrofit voltage detection system of claim 1 in which a second electrical fixture is integral with the pool wall, with the retrofit voltage detection system further comprising:
   a third elongate conductive element out of a second pair of elongate conductive elements, with the third elongate conductive element having a detector electrode end and a connecting end, with the third elongate conductive element for attachment to the pool wall, and with the detector electrode end of the third elongate conductive element adjacent to a third surface of the pool wall, and adjacent to and as close as practicable to the second electrical fixture;
   a fourth elongate conductive element out of the second pair of elongate elements, with the fourth elongate conductive element having a reference electrode end and a connecting end, with the fourth elongate conductive element for attachment to the pool wall, and with the reference electrode end of the fourth elongate conductive element adjacent to a fourth surface of the pool wall, which is across from and facing the third surface of the pool wall;
   the wireless transmitter in electrical connection with the connecting ends of corresponding third and fourth elongate conductive elements, and with the wireless transmitter enabled: to detect a second stray voltage between the detector electrode end of the third elongate conductive element and the reference electrode end of the fourth elongate conductive element; and to generate and wirelessly transmit a second voltage value signal; and the wireless receiver in wireless communication with the wireless transmitter, with the wireless receiver enabled: to receive the second voltage value signal from the wireless transmitter; to compare the second voltage value signal to a predetermined threshold voltage value; and to generate an alert indicating that a dangerous stray voltage has been detected in the pool water if the second voltage value signal exceeds the predetermined threshold voltage value.

12. The retrofit voltage detection system of claim 11 in which the reference electrode end of the fourth elongate conductive element is positioned so as to maximize the distance between the reference electrode end of the fourth elongate conductive element and the detector electrode end of the third elongate conductive element.

13. A retrofit voltage detection system for detecting a stray voltage in pool water contained within a pool caused by an electrical fixture integral with a pool wall of the pool, with the retrofit voltage detection system comprising:
   a first elongate conductive element out of a pair of elongate conductive elements, with the first elongate conductive element having a detector electrode end and a connecting end, with the first elongate conductive element for attachment to the pool wall, and with the detector electrode end of the first elongate conductive element adjacent to a first surface of the pool wall and adjacent to and as close as practicable to the electrical fixture;
   a second elongate conductive element out of the pair of elongate conductive elements, having a reference electrode end and a connecting end, with the second elongate conductive element for attachment to the pool wall, with the reference electrode end adjacent to a second surface of the pool wall, and with the reference electrode end positioned so as to maximize the distance between reference electrode end and the detector electrode end;
   a wireless transmitter in electrical connection with the connecting ends of corresponding first and second elongate conductive elements, and with the wireless transmitter enabled: to detect a stray voltage between the detector electrode end of the first elongate conductive element and the reference electrode end of the second elongate conductive element; and to generate and wirelessly transmit a voltage value signal; and
   a wireless receiver in wireless communication with the wireless transmitter, with the wireless receiver enabled: to receive the voltage value signal from the wireless transmitter; to compare the voltage value signal to a predetermined threshold voltage value; and to generate an alert indicating that a dangerous stray voltage has been detected in the pool water if the voltage value signal exceeds the predetermined threshold voltage value.

14. A voltage detection system for detecting a stray voltage in pool water contained in a pool caused by a first electrical fixture integral with a pool wall of the pool, with the voltage detection system comprising:
   a first elongate conductive element out of a first pair of elongate conductive elements, with the first elongate conductive element having a detector electrode end and a connecting end, with the first elongate conductive element disposed within the pool wall, and with the detector electrode end of the first elongate conductive element disposed within a first pool wall opening through the pool wall and positioned adjacent to and as close as practicable to the first electrical fixture;
   a second elongate conductive element out of the first pair of elongate conductive elements, with the second elongate conductive element having a reference electrode end and a connecting end, with the second elongate conductive element disposed within the pool wall, with the reference electrode end of the second elongate conductive element disposed within a second pool wall opening through the pool wall, and with the second pool wall opening across from and facing the first pool wall opening; and
   a the microcontroller unit in electrical connection with the connecting ends of corresponding first and second elongate conductive elements, and with the microcontroller unit enabled: to detect a first stray voltage between the detector electrode end of the first elongate conductive element and the reference electrode end of the second elongate conductive element; to generate a first voltage value signal from the first stray voltage; to compare the first voltage value signal to a predetermined threshold voltage value; and to generate an alert indicating that a dangerous stray voltage has been detected in the pool water if the first voltage value signal exceeds the predetermined threshold voltage value.

15. The voltage detection system of claim 14 in which the reference electrode end of the second elongate conductive element is positioned so as to maximize the distance between reference electrode end of the second elongate conductive element and the detector electrode end of the first elongate conductive element.

16. The voltage detection system of claim 14 in which a second electrical fixture is integral with the pool, with the voltage detection system also comprising:
   a third elongate conductive element out of a second pair of elongate conductive elements, with the third elongate conductive element having a detector electrode end and a connecting end, with the third elongate conductive element disposed within the pool wall, and with the detector electrode end of the third elongate conductive element disposed within a third pool wall opening through the pool wall and positioned adjacent to and as close as practicable to the second electrical fixture;
   a fourth elongate conductive element out of the second pair of elongate conductive elements, with the fourth elongate conductive element having a reference electrode end and a connecting end, with the fourth elongate conductive element disposed within the pool wall, with the reference electrode end of the fourth elongate conductive element disposed within a fourth pool wall opening through the pool wall, and with the fourth pool wall opening across from and facing the third pool wall opening; and
   the microcontroller unit in electrical connection with the connecting ends of the third and fourth elongate conductive elements, and with the microcontroller unit enabled: to detect a second stray voltage between the detector electrode end of the third elongate conductive element and the reference electrode end of the fourth elongate conductive element; to generate a second voltage value signal from the stray second voltage; to compare the second voltage value signal to the predetermined threshold voltage value; and to generate an alert indicating that a dangerous stray voltage has been detected in the pool water if the second voltage value signal exceeds the predetermined threshold voltage value.

17. The voltage detection system of claim 16 in which the reference electrode end of the fourth elongate conductive element is positioned so as to maximize the distance between the reference electrode end of the fourth elongate conductive element and the detector electrode end of the third elongate conductive element.

18. A voltage detection system for detecting a stray voltage in pool water contained within a pool caused by an electrical fixture integral with a pool wall of the pool, with the voltage detection system comprising:
- a first elongate conductive element out of a pair of elongate conductive elements, with the first elongate conductive element having a detector electrode end and a connecting end, with the first elongate conductive element disposed within the pool wall, with the detector electrode end disposed within a first pool wall opening through the pool wall and positioned adjacent to and as close as practicable to the electrical fixture;
- a second elongate conductive element out of the pair of elongate conductive elements, with the second elongate conductive element disposed within the pool wall, with the reference electrode end disposed within a second pool wall opening through the pool wall, and with the reference electrode end positioned so as to maximize the distance between reference electrode end and the detector electrode end; and
- a microcontroller unit in electrical connection with the connecting end of the first and second elongate conductive elements, with the microcontroller unit enabled: to detect a stray voltage between the detector electrode end of the first elongate conductive element and the reference electrode end of the second elongate conductive element; to generate a voltage value signal from the stray voltage; to compare the voltage value signal to a predetermined threshold voltage value; and to generate an alert indicating that a dangerous stray voltage has been detected in the pool water if the voltage value signal exceeds the predetermined threshold voltage value.

19. A retrofit voltage detection system for detecting a stray voltage in pool water contained within a pool caused by an electrical ground current, with the retrofit voltage detection system comprising:
- a first elongate conductive element out of a first pair of elongate conductive elements, with the first elongate conductive element having an electrode end and a connecting end, with the first elongate conductive element for attachment to a pool wall, and with the electrode end of the first elongate conductive element adjacent to a first surface of the pool wall;
- second elongate conductive element out of the first pair of elongate conductive elements, with the second elongate conductive element having an electrode end and a connecting end, with the second elongate conductive element for attachment to the pool wall, and with the electrode end of the second elongate conductive element adjacent to a second surface of the pool wall;
- a third elongate conductive element out of a second pair of elongate conductive elements, with the third elongate conductive element having an electrode end and a connecting end, with the third elongate conductive element for attachment to the pool wall, and with the electrode end of the third elongate conductive element adjacent to a third surface of the pool wall;
- a fourth elongate conductive element out of the second pair of elongate conductive elements, with the fourth elongated conductive element having an electrode end and a connecting end, with the fourth elongate conductive element for attachment to the pool wall, with the electrode end of the fourth elongate conductive element adjacent to a fourth surface of the pool wall, and with the first and second pair of elongate conductive elements positioned such that the electrode ends of the first pair of elongate conductive elements and the electrode ends of the second pair of elongate conductive elements are positioned around an inside perimeter of the pool wall such that each electrode end is equidistant from adjacent electrode ends;
- a wireless transmitter in electrical connection with the connecting ends of the first, second, third and fourth elongate conductive elements, with the wireless transmitter enabled: to detect a first voltage between the electrode ends of corresponding first and second elongate electrode elements; to detect a second voltage between the electrode ends of corresponding third and fourth elongate electrode elements; and to generate and wirelessly transmit a first and a second voltage value signal; and
- a wireless receiver in wireless connection with the wireless transmitter, with the wireless receiver enabled: to receive the first and second voltage value signals from the wireless transmitter; to compare the first and second voltage value signals to a predetermined threshold voltage value; and to generate an alert indicating that a dangerous stray voltage has been detected in the pool water if either of the first or second voltage value signal exceeds the predetermined threshold voltage value.

20. The retrofit voltage detection system of in claim 19 in which the electrode ends of corresponding first and second conductive elements and the electrode ends of corresponding third and fourth elongate electrode elements are positioned such that each electrode end is below a predetermined water level of the pool water.

21. The retrofit voltage detection system of in claim 19 in which the electrode ends of corresponding first and second conductive elements and the electrode ends of corresponding third and fourth elongate electrode elements are positioned such that each electrode end is equidistant from a predetermined water level of the pool water and a bottom of the pool.

22. A voltage detection system for detecting a stray voltage in pool water contained within a pool caused by an electrical ground current, comprising:
- a first elongate conductive element out of a first pair of elongate conductive elements, with the first elongate conductive element having an electrode end and a connecting end, with the first elongate conductive element disposed within the pool wall, and with the electrode end of the first elongate electrode disposed within a first pool wall opening through the pool wall;
- a second elongate conductive element out of the first pair of elongate conductive elements, with the second elongate conductive element having an electrode end and a connecting end, with the second elongate conductive element disposed within the pool wall, and with the electrode end of the second elongate conductive element disposed within a second pool wall opening through the pool wall;
- a third elongate conductive element out of a second pair of elongate conductive elements, with the third elongate conductive element having an electrode end and a connecting end, with the third elongate conductive element disposed within the pool wall, and with the electrode end of the third elongate conductive electrode disposed within a third pool wall opening through the pool wall;

a fourth elongate conductive element out of the second pair of elongate conductive elements, with the fourth elongate conductive element having an electrode end and a connecting end, with the fourth elongate conductive element disposed within the pool wall, and with the electrode end of the fourth elongate conductive element disposed within a fourth pool wall opening through the pool wall, and with the first and second pair of elongate conductive elements positioned such that the electrode ends of the first pair of elongate conductive elements and the electrode ends of the second pair of elongate conductive elements are positioned around an inside perimeter of the pool wall such that each electrode end is equidistant from adjacent electrode ends;

a microcontroller unit in electrical connection with the connecting ends of the first, second, third and fourth elongate conductive elements, and with the microcontroller unit enabled: to detect a first voltage between the electrode ends of corresponding first and second elongate electrode elements; to detect a second voltage between the electrode ends of corresponding third and fourth elongate electrode elements; to generate and compare first and second voltage value signals to a predetermined threshold voltage value; and to generate an alert indicating that a dangerous stray voltage has been detected in the pool water if the first or second voltage value signal exceeds the predetermined threshold voltage value.

* * * * *